(12) United States Patent
Hosek et al.

(10) Patent No.: US 10,020,704 B2
(45) Date of Patent: Jul. 10, 2018

(54) ELECTRICAL CONNECTION THROUGH MOTOR HOUSING

(71) Applicant: Persimmon Technologies, Corp., Wakefield, MA (US)

(72) Inventors: Martin Hosek, Lowell, MA (US); Tuan Ha, Randolph, MA (US); Christopher Hofmeister, Hampstead, NH (US); Dennis Poole, East Derry, NH (US)

(73) Assignee: Persimmon Technologies Corporation, Wakefield, MA (US)

( * ) Notice: Subject to any disclaimer, the term of this patent is extended or adjusted under 35 U.S.C. 154(b) by 0 days.

(21) Appl. No.: 15/789,382

(22) Filed: Oct. 20, 2017

(65) Prior Publication Data

US 2018/0041089 A1 Feb. 8, 2018

Related U.S. Application Data

(62) Division of application No. 13/744,900, filed on Jan. 18, 2013, now Pat. No. 9,800,114, which is a division of application No. 13/618,315, filed on Sep. 14, 2012.

(Continued)

(51) Int. Cl.
*H02K 11/00* (2016.01)
*H02K 5/128* (2006.01)
(Continued)

(52) U.S. Cl.
CPC .............. *H02K 5/128* (2013.01); *H02K 5/00* (2013.01); *H02K 5/225* (2013.01); *H02K 9/22* (2013.01);
(Continued)

(58) Field of Classification Search
CPC ..... H02K 5/225; H02K 5/132; H02K 2203/03
(Continued)

(56) References Cited

U.S. PATENT DOCUMENTS 636,808 A 11/1899 Judy
3,602,748 A * 8/1971 Locke .................... H01R 29/00
310/71
(Continued)

FOREIGN PATENT DOCUMENTS

CN 101861234 A 10/2010
EP 0111764 A1 6/1984
(Continued)

OTHER PUBLICATIONS

Popan, A.D., Viorel, I.A., Blissenbach, R.; A Passive Rotor Transverse Flux Motor; Technical University of Cluj, C. Daicoviciu No. 15, Cluj-Napoca, 3400, Romania,alin.popn@mae.utcluj.ro; Technical University of Cluj, C. Daicoviciu No. 15, Cluj-Napoca, 3400, Romania, ioan.adrian.viorel@mae.utcluj IEM-RWTH, Schinkelstrasse No. 4, D-52062, Aachen, Germany,blissenbach@iem.rwth-aachen.de.
(Continued)

*Primary Examiner* — Thanh Lam
(74) *Attorney, Agent, or Firm* — Harrington & Smith

(57) ABSTRACT

An apparatus including a motor housing which includes a plurality of electrical connector apertures through the motor housing; a plurality of first electrical connectors which include a projecting pin section; a plurality of second electrical connectors which include a socket section configured to receive a respective projecting pin section; and a casing configured to press the first electrical connectors against respective seals at the electrical connector apertures to seal the electrical connector apertures. The first electrical connectors project through the respective seals. The projecting pin sections are located in the respective socket sections of the second electrical connectors with a press-fit therebetween to thereby connect the first and second electrical connectors.

19 Claims, 14 Drawing Sheets

Related U.S. Application Data

(60) Provisional application No. 61/627,030, filed on Sep. 16, 2011, provisional application No. 61/683,297, filed on Aug. 15, 2012.

(51) Int. Cl.

| | | |
|---|---|---|
| *H02K 5/22* | (2006.01) | |
| *H02K 21/44* | (2006.01) | |
| *H02K 41/03* | (2006.01) | |
| *H02K 5/00* | (2006.01) | |
| *H02K 9/22* | (2006.01) | |
| *H02K 3/30* | (2006.01) | |
| *H02K 3/44* | (2006.01) | |
| *H02K 15/12* | (2006.01) | |

(52) U.S. Cl.
CPC .......... *H02K 21/44* (2013.01); *H02K 41/033* (2013.01); *H02K 3/30* (2013.01); *H02K 3/44* (2013.01); *H02K 15/12* (2013.01); *Y10S 901/23* (2013.01)

(58) Field of Classification Search
USPC ............................................. 310/71, 88–89
See application file for complete search history.

(56) References Cited

U.S. PATENT DOCUMENTS

| | | | |
|---|---|---|---|
| 3,963,949 A | 6/1976 | Church | |
| 4,414,523 A | 11/1983 | Pieters | 335/302 |
| 4,486,677 A | 12/1984 | Yamamoto et al. | 310/64 |
| 4,702,668 A | 10/1987 | Carlisle et al. | 414/744 |
| 4,748,355 A * | 5/1988 | Anderson | H02K 5/225 310/71 |
| 4,749,898 A | 6/1988 | Suzuki et al. | 310/114 |
| 4,952,830 A | 8/1990 | Shirakawa | |
| 5,065,061 A | 11/1991 | Satoh | |
| 5,113,102 A | 5/1992 | Gilmore | 310/88 |
| 5,209,699 A | 5/1993 | Hashimoto et al. | 464/29 |
| 5,270,600 A | 12/1993 | Hashimoto | 310/75 |
| 5,291,087 A | 3/1994 | Pollick et al. | 310/86 |
| 5,394,043 A | 2/1995 | Hsia | 310/90 |
| 5,397,212 A | 3/1995 | Watanabe et al. | 414/744.6 |
| 5,608,277 A | 3/1997 | Emery et al. | |
| 5,641,276 A | 6/1997 | Heidelberg et al. | |
| 5,720,590 A | 2/1998 | Hofmeister | 414/744.2 |
| 5,806,169 A | 9/1998 | Trago et al. | |
| 5,813,823 A | 9/1998 | Hofmeister | |
| 5,834,865 A | 11/1998 | Sugiura | 310/49 |
| 5,894,760 A | 4/1999 | Caveney | |
| 5,899,658 A | 5/1999 | Hofmeister | 414/744.5 |
| 5,914,548 A | 6/1999 | Watanabe et al. | 310/88 |
| 6,150,747 A | 11/2000 | Smith et al. | 310/258 |
| 6,203,294 B1 | 3/2001 | Turley et al. | |
| 6,274,962 B1 | 8/2001 | Kliman | 310/261 |
| 6,351,042 B1 | 2/2002 | Takayanagi | |
| 6,355,999 B1 | 3/2002 | Kichiji et al. | 310/112 |
| 6,653,758 B2 | 11/2003 | Tsuneyoshi et al. | 310/216 |
| 6,664,535 B1 | 12/2003 | Nahum et al. | |
| 6,700,249 B1 | 3/2004 | Botos | 310/80 |
| 6,709,521 B1 | 3/2004 | Hiroki | 118/719 |
| 6,710,562 B1 | 3/2004 | Kalb et al. | 318/434 |
| 6,758,876 B2 | 7/2004 | Suzuki et al. | |
| 6,888,284 B2 | 5/2005 | Eggers et al. | 310/218 |
| 6,960,758 B2 | 11/2005 | Tenca et al. | |
| 7,011,554 B2 | 3/2006 | Taniguchi et al. | |
| 7,336,012 B2 | 2/2008 | Tanaka | 310/112 |
| 7,704,036 B2 | 4/2010 | Sato | 414/744.5 |
| 7,800,256 B2 | 9/2010 | Jajtic et al. | 310/12.01 |
| 7,847,442 B2 | 12/2010 | Rohner et al. | 310/12.14 |
| 7,898,135 B2 | 3/2011 | Flynn | 310/152 |
| 7,950,890 B2 | 5/2011 | Nakamura et al. | 414/217 |
| 7,988,398 B2 | 8/2011 | Hofmeister et al. | |
| 8,063,517 B2 | 11/2011 | Bott et al. | 310/12.14 |
| 8,102,090 B2 | 1/2012 | Takeuchi | 310/156.32 |
| 8,237,391 B2 | 8/2012 | Krupyshev et al. | |
| 8,283,813 B2 | 10/2012 | Gilchrist et al. | |
| 8,716,909 B2 | 5/2014 | Hosek et al. | |
| 9,202,733 B2 | 12/2015 | Hosek | |
| 2001/0036398 A1 | 11/2001 | Hofmeister | |
| 2002/0029936 A1 | 3/2002 | McClintock et al. | 187/267 |
| 2003/0164652 A1 | 9/2003 | Tamura et al. | |
| 2004/0001750 A1 | 1/2004 | Kremerman | 414/744.1 |
| 2005/0286993 A1 | 12/2005 | Minami et al. | 414/744.5 |
| 2006/0290226 A1* | 12/2006 | Ohkawa | H02K 3/525 310/194 |
| 2007/0022304 A1 | 1/2007 | Yanagawa | |
| 2007/0029890 A1 | 2/2007 | Deodhar et al. | |
| 2007/0280813 A1 | 12/2007 | Nakamura et al. | 414/744.5 |
| 2008/0048512 A1 | 2/2008 | Ito | |
| 2008/0315692 A1 | 12/2008 | Beetz | |
| 2009/0003976 A1 | 1/2009 | Hofmeister | |
| 2009/0243413 A1 | 10/2009 | Gilchrist et al. | |
| 2010/0156235 A1 | 6/2010 | Qin et al. | |
| 2011/0057529 A1 | 3/2011 | Seidel et al. | |
| 2011/0089751 A1 | 4/2011 | Saillet | 301/95.103 |
| 2011/0133582 A1 | 6/2011 | Bingler | |
| 2011/0156514 A1 | 6/2011 | Watanabe et al. | 310/86 |
| 2011/0256003 A1 | 10/2011 | Ohtsubo | |
| 2011/0266900 A1* | 11/2011 | Gaumer | H02K 5/225 310/71 |
| 2013/0028700 A1 | 1/2013 | Gilchrist et al. | 414/800 |
| 2013/0121798 A1 | 5/2013 | Hosek | 414/744.5 |
| 2014/0077637 A1 | 3/2014 | Hosek et al. | |
| 2015/0214086 A1 | 7/2015 | Hofmeister et al. | |
| 2015/0303764 A1 | 10/2015 | Hosek et al. | |
| 2015/0311639 A1* | 10/2015 | Neureiter | B60K 1/00 310/71 |
| 2016/0190728 A1* | 6/2016 | VanZuilen | H01R 12/585 310/71 |
| 2016/0229296 A1 | 8/2016 | Hosek et al. | |
| 2017/0036358 A1 | 2/2017 | Hosek et al. | |

FOREIGN PATENT DOCUMENTS

| | | |
|---|---|---|
| EP | 0146783 A2 | 7/1985 |
| EP | 0385203 A1 | 9/1990 |
| JP | 06-042602 | 2/1994 |
| JP | H08-19985 A | 1/1996 |
| JP | 08-066880 | 3/1996 |
| JP | 10-128692 | 5/1998 |
| JP | 2002534282 A | 10/2002 |
| JP | 2003-220586 | 8/2003 |
| JP | 2004-146714 | 5/2004 |
| JP | 2009038908 A | 2/2009 |
| JP | 2009521196 A | 5/2009 |
| JP | 2009521196 A | 5/2009 |
| JP | 2009-303331 | 12/2009 |
| JP | 2010040947 A | 2/2010 |
| JP | 2010050114 A | 3/2010 |
| JP | 2006013371 A | 1/2016 |
| WO | WO-91/03095 | 3/1991 |
| WO | WO-2004016401 A1 | 2/2004 |
| WO | WO-2006/114390 A1 | 11/2006 |
| WO | WO-2006/124934 A2 | 11/2006 |
| WO | WO-2006/130954 A1 | 12/2006 |
| WO | WO-2009003196 | 12/2008 |

OTHER PUBLICATIONS

Cluj, C. Davidson No. 15, Cluj-Napoca, 3400, Romania, joan.adrian.viorel#mae.utcluj IEM—RWTH, Schinkelstrasse No. 4, D-52062, Aachen, Germany, blissenbach@iem.rwth-aachen.de.

* cited by examiner

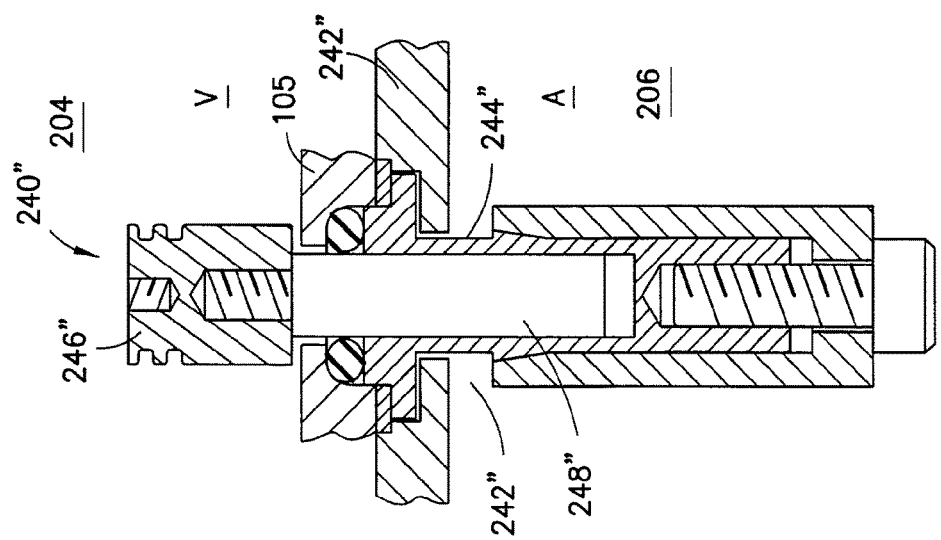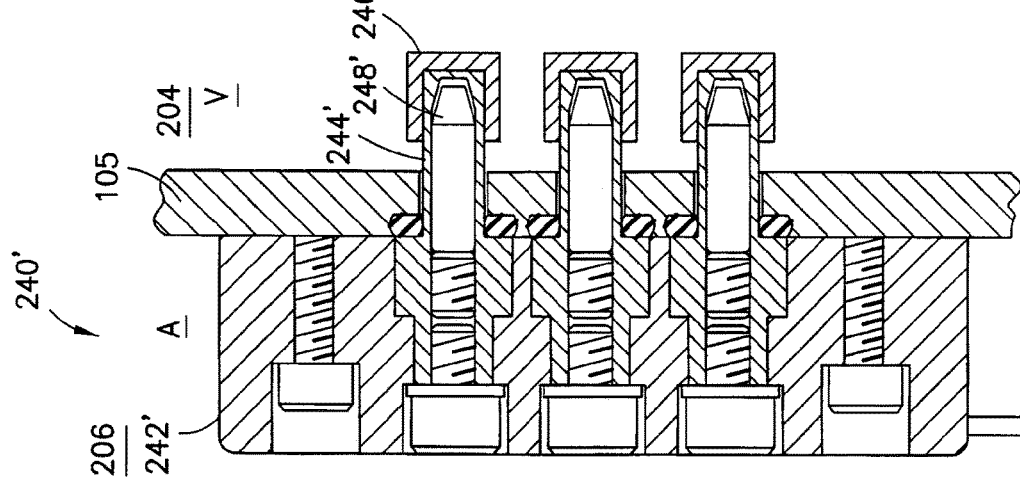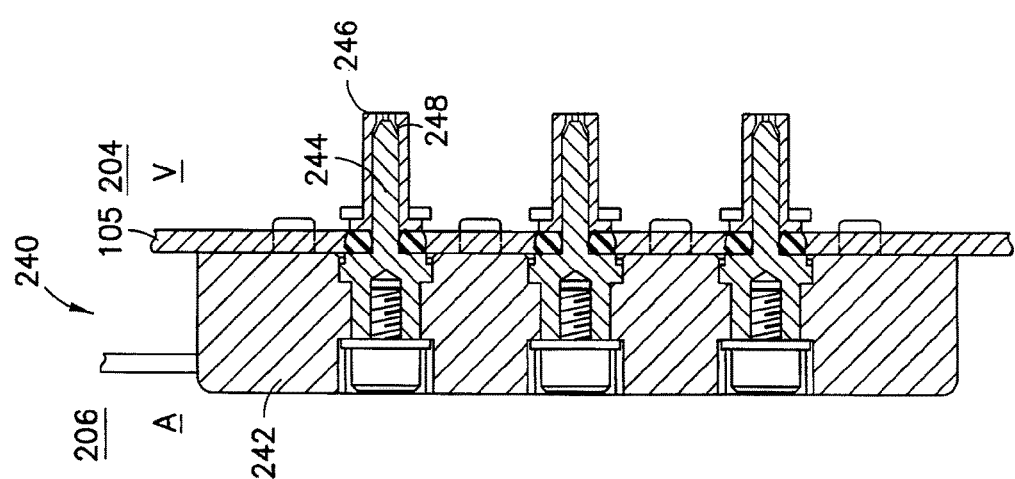

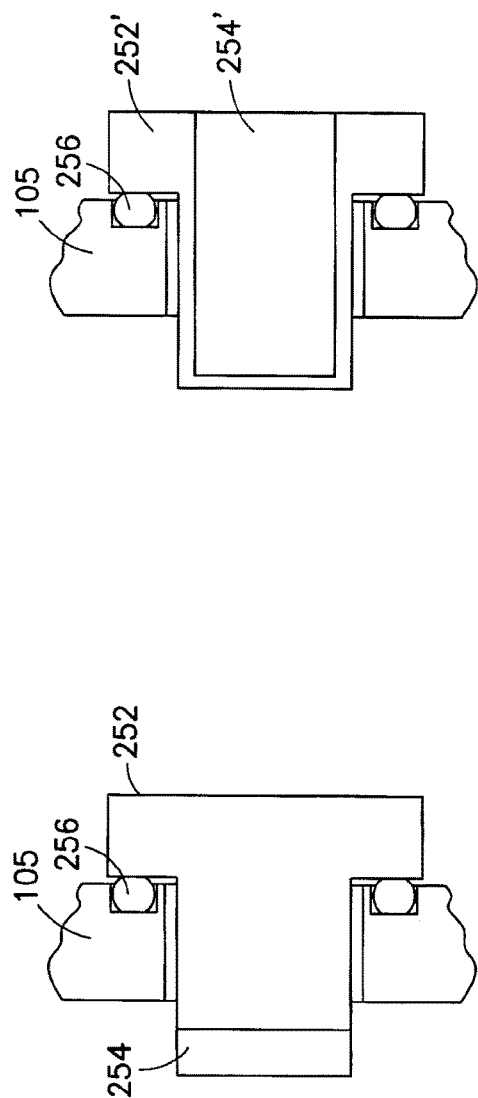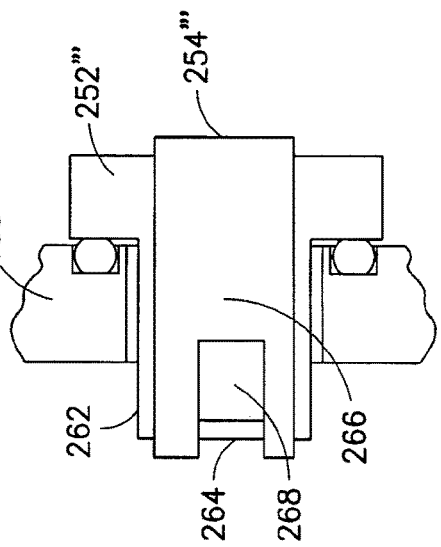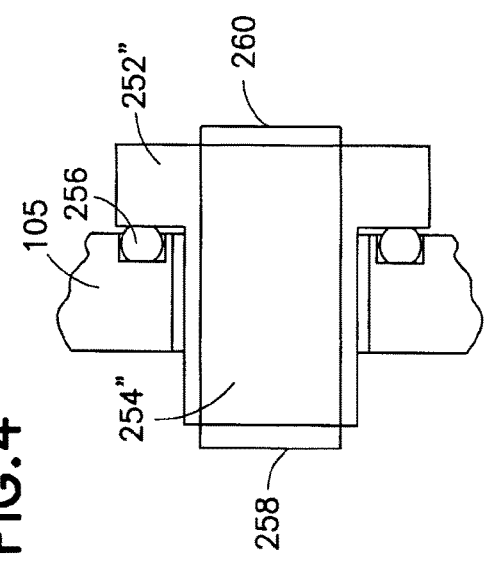

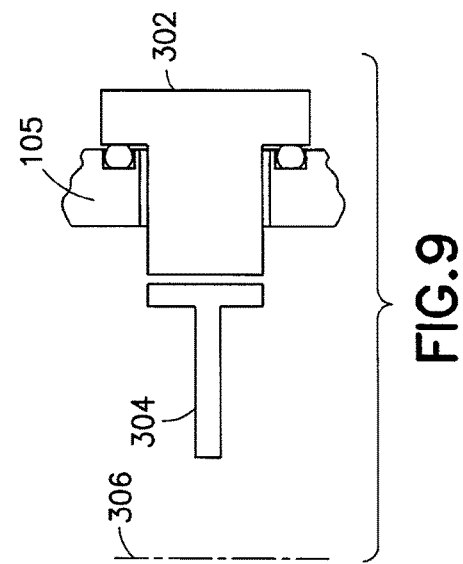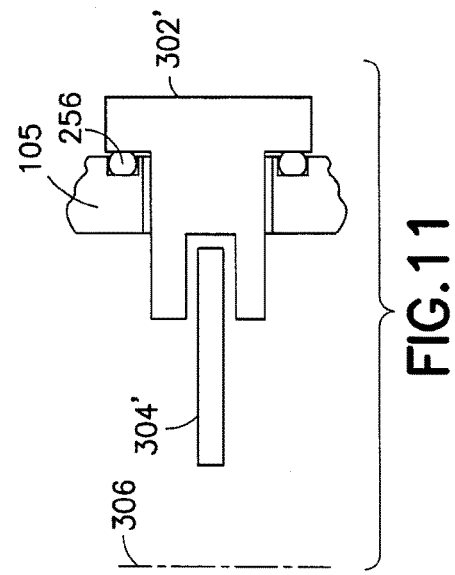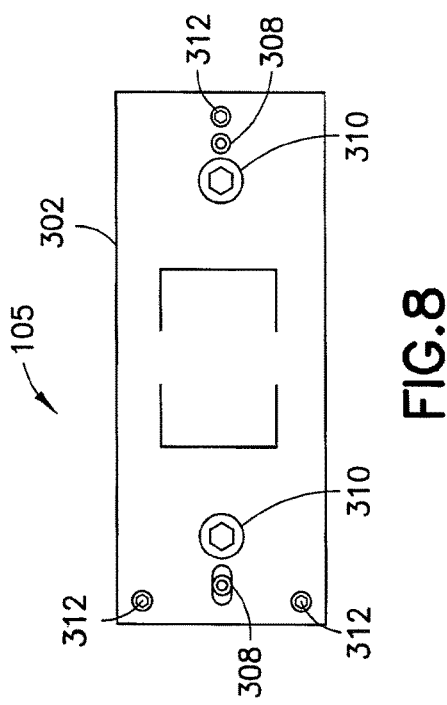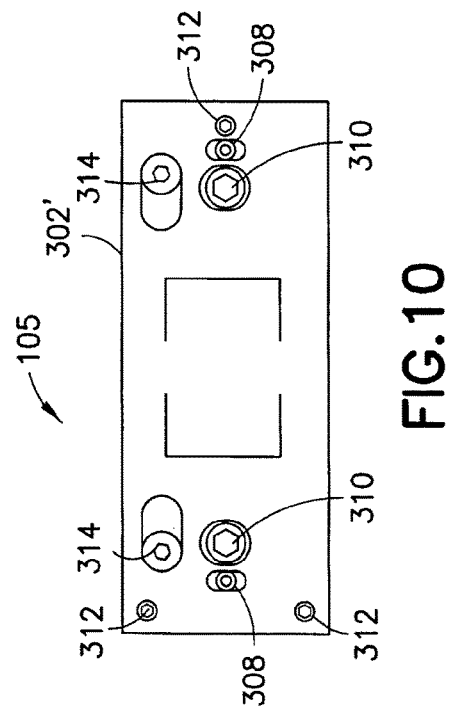

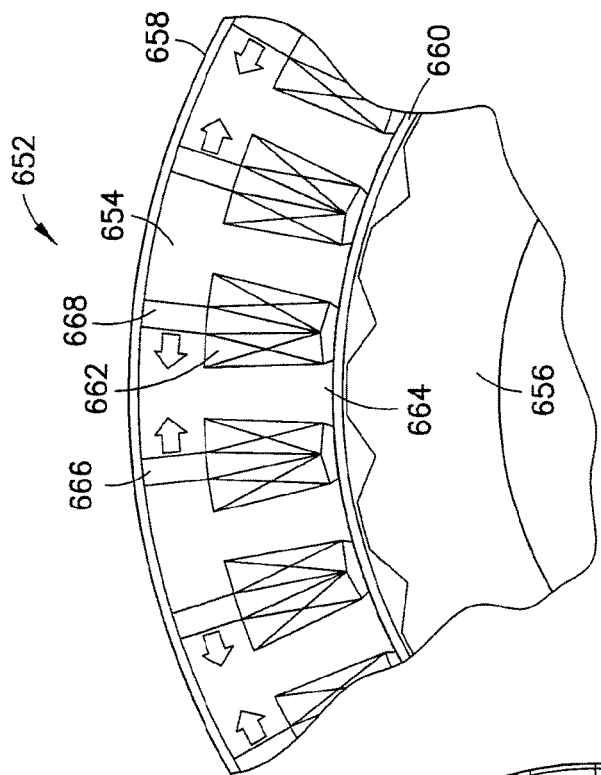
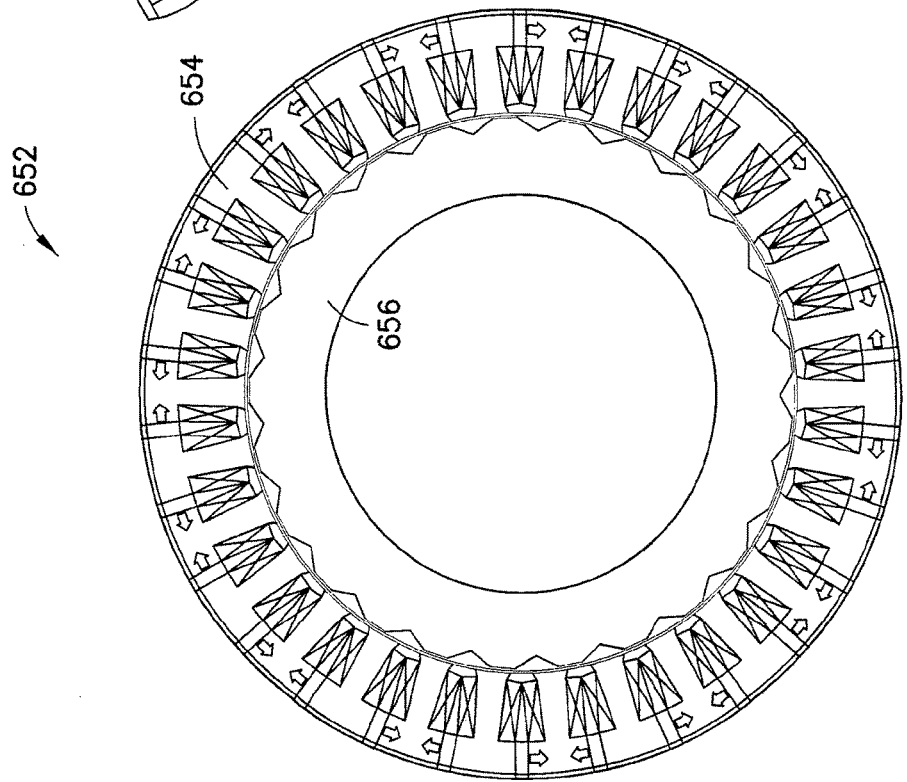

ELECTRICAL CONNECTION THROUGH MOTOR HOUSING

CROSS REFERENCE TO RELATED APPLICATIONS

This is a divisional patent application of copending U.S. application Ser. No. 13/744,900 filed Jan. 18, 2013, which is a divisional patent application of U.S. application Ser. No. 13/618,315 filed Sep. 14, 2012, which claims priority under 35 USC 119(e) on Provisional Patent Application No. 61/627,030 filed Sep. 16, 2011 and Provisional Patent Application No. 61/683,297 filed Aug. 15, 2012, which are hereby incorporated by reference in their entireties.

BACKGROUND

Technical Field

The exemplary and non-limiting embodiments relate generally to a robot drive and, more particularly, to an electrical connection through a motor housing.

Brief Description of Prior Developments

Conventional manufacturing technologies for semiconductor integrated circuits and flat panel displays often include processing of silicon wafers and glass panels, often referred to as substrates, in fully automated cluster tools. A typical cluster tool may include a vacuum chamber with load locks and process modules. The tool is typically serviced by a robotic manipulator (robot or substrate transport apparatus) which cycles the substrates from the load locks, through the process modules, and back to the load locks. Another robot may be located in an atmospheric transfer module which serves as an interface between the load locks of the vacuum chamber and standardized load ports serviced by an external transportation system.

SUMMARY

The following summary is merely intended to be exemplary. The summary is not intended to limit the scope of the claims.

In accordance with one aspect, an example embodiment, an apparatus is provided comprising a motor housing configured to form a first environmental area inside the motor housing separated from a second environmental area outside of the motor housing, where the motor housing comprises electrical connector apertures through the motor housing; a plurality of first electrical connectors, where each of the first electrical connectors comprise a projecting pin section; a plurality of second electrical connectors, where each of the second electrical connectors comprise a socket section configured to receive the projecting pin section of a respective one of the first electrical connectors; and a casing configured to mount to the motor housing, where the casing is configured to press the first electrical connectors or the second electrical connectors against respective seals at respective ones of the electrical connector apertures to seal the electrical connector apertures, where the first electrical connectors contact the respective seals and project through the respective seals, where the projecting pin sections of the first electrical connectors are located in the socket sections of the second electrical connectors forming an interference fit therebetween to thereby connect the first and second electrical connectors.

In accordance with another aspect, an example embodiment is provided in an apparatus comprising a motor housing configured to form a first environmental area inside the motor housing separated from a second environmental area outside of the motor housing, where the motor housing comprises a plurality of electrical connector apertures through the motor housing; a plurality of first electrical connectors, where each of the first electrical connectors comprise a projecting pin section; a plurality of second electrical connectors, where each of the second electrical connectors comprise a socket section configured to receive the projecting pin section of a respective one of the first electrical connectors; and a casing configured to press the first electrical connectors against respective seals at the electrical connector apertures to seal the electrical connector apertures, where the first electrical connectors project through the respective seals, where the projecting pin sections of the first electrical connectors are located in the respective socket sections of the second electrical connectors with a press-fit therebetween to thereby connect the first and second electrical connectors.

In accordance with another aspect, an example method comprises inserting first electrical connectors into electrical connector apertures in a motor housing; pressing projecting pin sections of the first electrical connectors into socket sections of respective second electrical connectors at the electrical connector apertures, where the second electrical connectors are located at least partially in the electrical connector apertures, and where the projecting pin sections form an interference fit connection with the respective socket sections of the second electrical connectors to thereby electrically connect the first and second electrical connectors; pressing at least one group of either the first electrical connectors or the second electrical connectors towards the motor housing by a casing to thereby press the electrical connectors of the at least one group against respective seals in the electrical connector apertures, where the seals are located in seal receiving pockets of the electrical connector apertures, where the seals are compressed between the at least one group of electrical connectors and the motor housing to seal the electrical connector apertures.

BRIEF DESCRIPTION OF THE DRAWINGS

The foregoing aspects and other features are explained in the following description, taken in connection with the accompanying drawings, wherein:

FIG. 2 is a schematic view of a feed-through;

FIG. 3A is a schematic view of another feed-through;

FIG. 3B is a schematic view of another feed-through;

FIG. 3C is a schematic view of another feed-through;

FIG. 3D is a schematic view of another feed-through;

FIG. 4 is a schematic view of a read-head connected to a housing;

FIG. 5 is a schematic view of another example of the read-head connected to the housing;

FIG. 6 is a schematic view of another example of the read-head connected to the housing;

FIG. 7 is a schematic view of another example of the read-head connected to the housing;

FIGS. 8 and 9 are schematic views of another example of the read-head connected to the housing;

FIGS. 10 and 11 are schematic views of another example of the read-head connected to the housing;

FIGS. 34-35 illustrate a motor with a toothed passive rotor; and

DETAILED DESCRIPTION OF EMBODIMENTS

Figure 1:
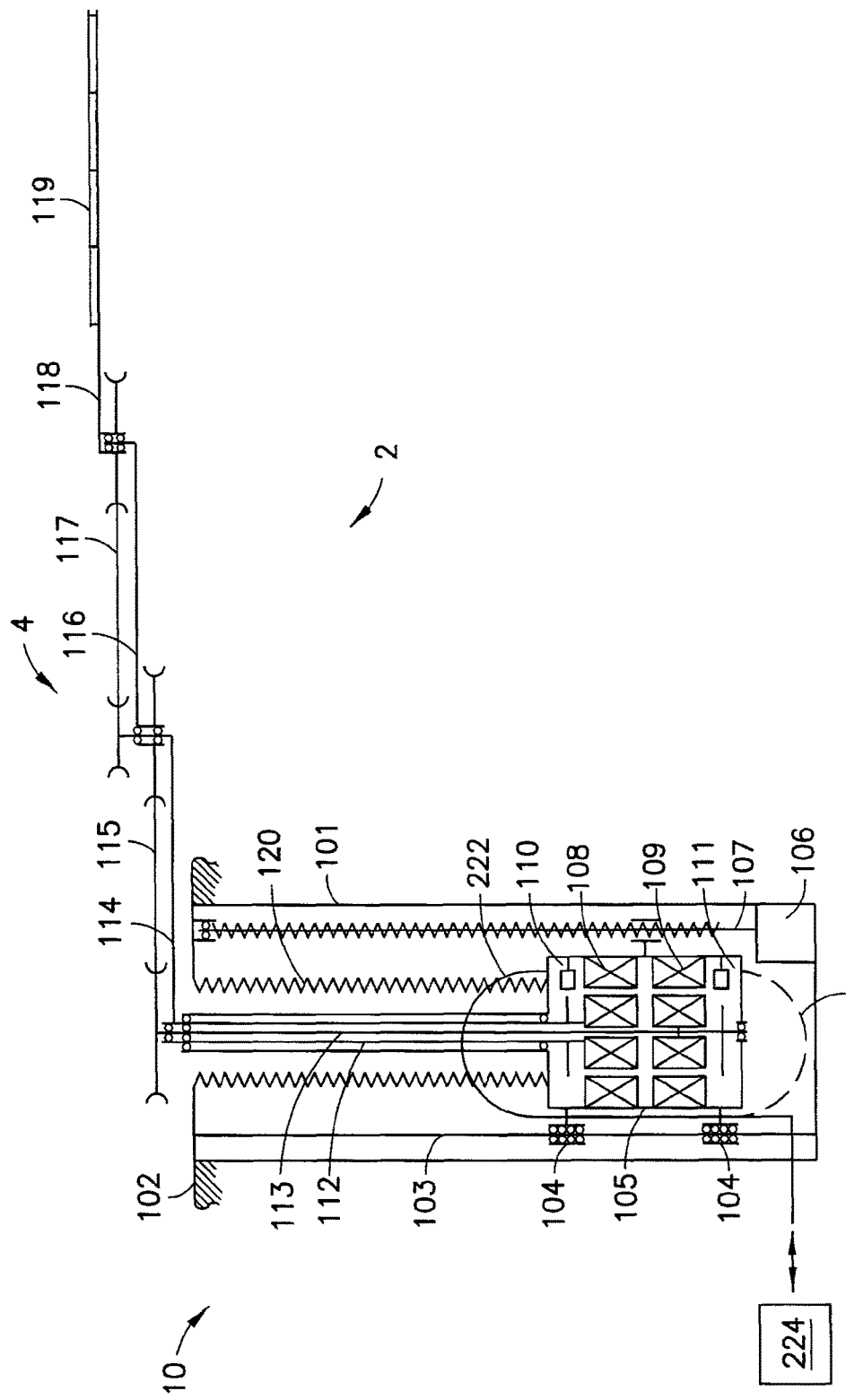
FIG. 1 is a schematic sectional view of an example apparatus.

Referring to FIG. 1, there is shown a schematic view of a robot drive 10 of a substrate transport apparatus 2. Although the robot drive 10 is described with respect to a vacuum robot, any suitable robot drive (atmospheric or otherwise) may be provided having features as disclosed. Drive 10 may incorporate features as previously disclosed or as disclosed herein. Aside from the preferred embodiment or embodiments disclosed, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

An example robotic manipulator or apparatus 2 incorporating the vacuum-compatible direct-drive system of one or more embodiments of this invention is shown in FIG. 1. The robotic manipulator may be built around frame 101, e.g., an aluminum extrusion, suspended from flange or mounting arrangement 102. Alternatively, the mounting arrangement may be on the side of frame 101, at the bottom of frame 101 or frame 101 may be mounted in any other suitable manner. Frame 101 may incorporate one or more vertical rail 103 with linear bearings 104 to provide guidance to housing 105 driven by motor 106 via ball-screw mechanism 107. Only one rail 103 is shown for simplicity. Alternatively, motor housing 105 may be driven by a linear motor, attached directly to frame 101 or coupled to frame 101 in any other suitable movable or unmovable manner. Motor housing 105 may incorporate one, two, three, four or more direct-drive modules as will be described in greater detail below. Housing 105 may house motors 108, 109 equipped with position encoders 110 and 111. Housing 105 is shown as an exemplary structure where housing 105 may have portions configured with respect to motors 108, 109 and position encoders 110 and 111 as will be described in greater detail below. Bellows 120 may be used to accommodate motion of motors 105 along vertical rail(s) 103, separating the environment where movable components of motors 108, 109 and encoders 110, 111 operate, for instance vacuum, from the outside environment, for example, atmosphere.

In the example of FIG. 1, two direct-drive modules, each having one motor and one encoder, are shown. However, any suitable number of direct-drive modules with any suitable number of motors and encoders may be used. Inverted service loop 222 may be utilized to supply power to the direct-drive module(s) and facilitate signaling between the direct-drive module(s) and other components of the robotic system, such as a controller 224, as shown in FIG. 1. Alternatively, a regular, non-inverted service loop 226 may be employed. As shown in FIG. 1, upper motor 108 may drive hollow outer shaft 112 connected to first link 114 of the robot arm. Lower motor 109 may be connected to coaxial inner shaft 113 which may be coupled via belt drive 115 to second link 116. Another belt arrangement 117 may be employed to maintain radial orientation of third link 118 regardless of the position of the first two links 114 and 116. This may be achieved due to a 1:2 ratio between the pulley incorporated into the first link and the pulley connected to the third link. Third link 118 may form an end-effector that may carry payload 119, for instance, a semiconductor substrate. It should be noted that the robotic arm of FIG. 1 is shown for exemplary purposes only. Any other suitable arm mechanism or drive mechanism may be used either alone or in combination. For example, multiple direct-drive modules according to one or more embodiments of this invention may be utilized in a single robotic manipulator or a robotic manipulator having multiple manipulators or any suitable combination. Here, the modules may be stacked in different planes along substantially the same axis of rotation, located concentrically in substantially the same plane, arranged in a configuration that combines the stacked and concentric arrangements, or incorporated into the robotic manipulator in any other suitable manner.

The vacuum-compatible direct-drive system of one or more embodiments of this invention may comprise a housing and a radial field motor arrangement including a stator and a rotor arranged in the vicinity of the stator so that it may rotate with respect to the stator and interact with the stator through a magnetic field substantially radial with respect to the axis of rotation of the rotor. Alternatively, an axial field motor or a combination radial/axial field motor may be provided, or combinations thereof. The stator may include a set of windings energized by a suitable controller based on the relative position of the rotor with respect to the stator. The rotor may include a set of permanent magnets with alternating polarity.

In the embodiment shown, the housing may separate an atmospheric type environment on the outside of the housing from a vacuum or other non-atmospheric environment inside of the housing. Active components, such as the encoder read head or the stator may be fastened to and/or interface with the housing as will be described, for example, the read head or stator may be pressed into or otherwise fastened to the housing to eliminate conventional clamping components and may be encapsulated in a suitable material, such as vacuum compatible epoxy based potting, to limit out-gassing of the components to the vacuum or other non-atmospheric environment as will be described. Here, the encapsulated component may be in vacuum, atmosphere or any suitable environment where the encapsulation protects the stator from the environment, e.g., prevents corrosion, and facilitates efficient heat removal. The encapsulation may also bond the read head or stator to the housing or other component or sub component, further securing the device with respect to the housing. The wires leading to the windings or other active components of the read head or windings of the stator may pass through an opening of the housing which is sealed by the encapsulation, thus eliminating the need for a separate vacuum feed-through, for example, as will be described with respect to FIG. 2. Alternatively, the read head or stator may be clamped, bolted or attached in any other suitable manner to the housing, and the wires leading from the atmospheric environment to the windings or other active components of the read head or the windings of the stator may be routed through a vacuum feed-through or passed through the wall of the housing in any other suitable manner, for example, as described with respect to FIGS. 3A-D.

Figure 2:
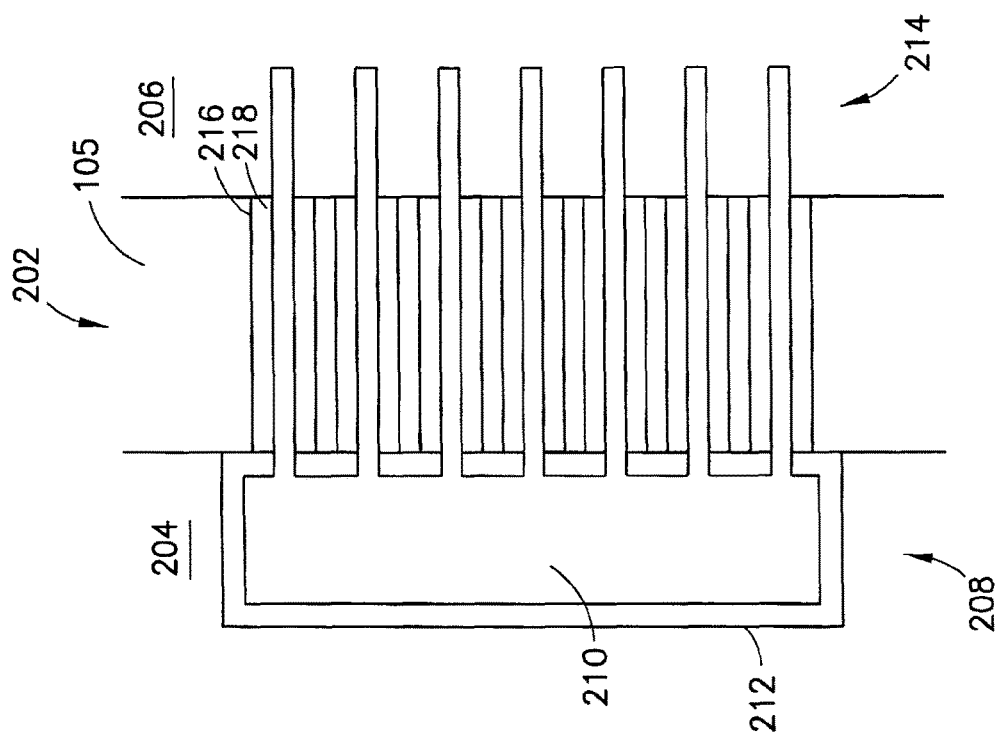

In FIG. 2, feed through 202 is shown interfacing with housing 105 where housing 105 may separate a first environment 204 from a second environment 206. Feed through 202 may interface with active component 208 where active component 208 may have active core 210 and leads 214. Active core 208 may be encased in closure 212 where closure 212 may be a coating, encapsulation, enclosure or combinations thereof in whole or in part as will be described. Alternately, closure 212 may not be provided. Leads 214 pass through holes 216 of housing 105 and are isolated from housing 105 by potting or isolation material 218. Here material 218 may be the same as material 212 or may be separately potted or otherwise isolated where material 218 may seal across a pressure gradient between environment 204 and 206 or otherwise.

Figure 3A:
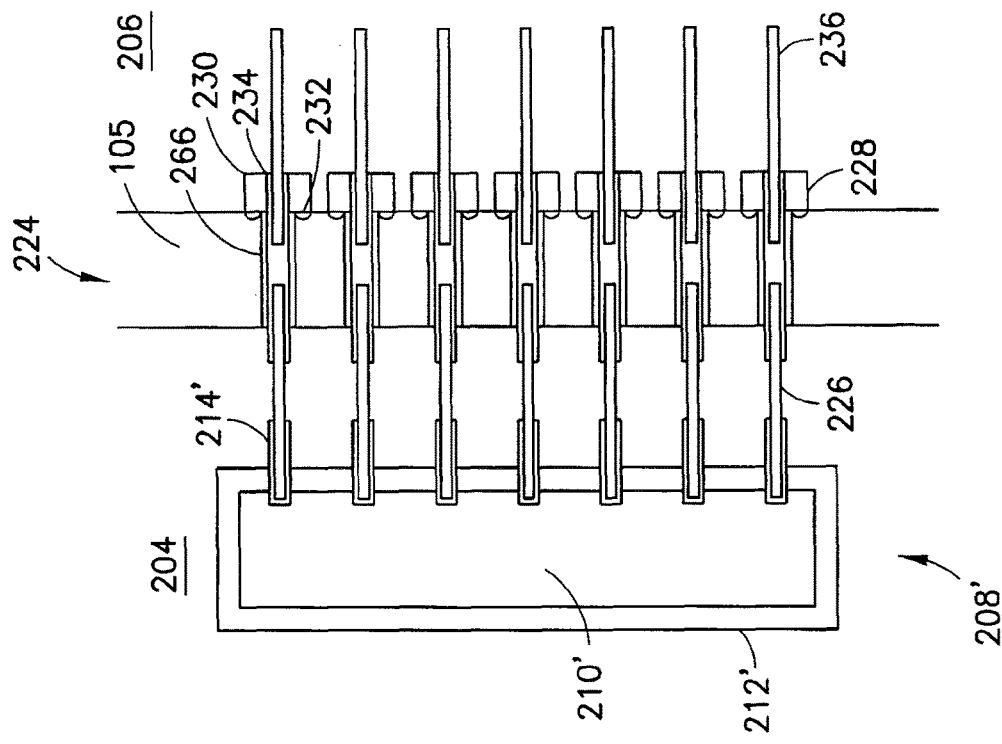

In FIG. 3A, feed through 224 is shown interfacing with housing 105 where housing 105 may separate a first environment 204 from a second environment 206. Feed through 224 may interface with active component 208' where active component 208' may have active core 210' and leads 214'. Active core 208' may be encased in closure 212' where closure 212' may be a coating, encapsulation, enclosure or combinations thereof in whole or in part as will be described. Alternately, closure 212' may not be provided. Leads 214' accept leads 226 that interface with feedthroughs 228 that pass through holes 216 of housing 105 and are isolated from housing 105 by insulated cores 230 where cores 230 are sealed 232 to housing 105. Here cores 230 have conductive inserts 234 hermetically sealed there to where conductive inserts accepts leads 226 on a first environment side 204 and further accept leads 236 on a second environment side 206. Here, cores 230 in combination with inserts 234 may seal across a pressure gradient between environment 204 and 206 or otherwise. In the embodiment disclosed, active components 208, 208' may be any suitable component, for example, a read head, winding or any suitable active component. Alternately, the pin (insert 234) may be sealed with respect to the housing 105, and the insulating material (core 230) may provide guidance and electrical insulation. Alternately, lead 226 and the insert 234 may be a single component, eliminating one connection. As will be described, an expandable feed-through may be provided which can be installed from the outside of housing 105 where the design may also accommodate for misalignment due to tolerances between the features in the housing and the features that the feed-throughs connect to in vacuum.

In FIG. 3B, feed through 240 is shown interfacing with housing 105 where housing 105 may separate a first environment 204 from a second environment 206. Here feed through 240 has insulated casing 242 and pins 244. Socket 246 is provided coupled to an electrical connection in the active component in environment 204. Pins 244 are shown sealed to housing 105 with an o-ring seal where pin 244 has a threaded end allowing coupling to a lug for electrical connection in environment 206. Socket 246 has tapered portion 248 such that insertion of pin 244 into socket 246 expands socket 246 such that electrical contact is made between pin 244 and socket 246 upon insertion and assembly.

In FIG. 3C, feed through 240' is shown interfacing with housing 105 where housing 105 may separate a first environment 204 from a second environment 206. Here feed through 240' has insulated casing 242' and pins 244'. Socket 246' is provided coupled to an electrical connection in the active component in environment 204. Pins 244' are shown sealed to housing 105 with an o-ring seal where pin 244' has a threaded end allowing coupling to a lug for electrical connection in environment 206. Pin 244' has tapered portion 248' such that after insertion of pin 244' into socket 246', rotation of a set screw moves an internal pin of pin 244' to expand pin 244' such that electrical contact is made between pin 244' and socket 246' upon assembly.

In FIG. 3D, feed through 240" is shown interfacing with housing 105 where housing 105 may separate a first environment 204 from a second environment 206. Here feed through 240" has insulated casing 242" and sockets 244". Pin 246" is provided coupled to an electrical connection in the active component in environment 204. Socket 244" is shown sealed to housing 105 with an o-ring seal where socket 244" has a threaded end allowing coupling to a lug for electrical connection in environment 206. Socket 244" has tapered portion 248" such that after insertion of socket 244" onto pin 246", rotation of a screw moves an external sleeve of socket 244" to compress socket 244" such that electrical contact is made between socket 244" and pin 246" upon assembly.

In order to determine the angular position of the driven part of the direct-drive module, e.g., the angular position of the motor rotor with respect to the housing, a position encoder may be incorporated into the direct-drive module. A position encoder track may be coupled to the driven part of the direct-drive module, and a position encoder read-head may be attached to the housing 105 of the direct-drive module, for example as seen in FIGS. 4-7. Here, the read head may be optical, inductive, or any suitable type of read head for position determination or otherwise.

In one exemplary embodiment as seen in FIG. 4, the read-head may have a casing 252 sealed to housing 105 with seal 256 with an active component 254 that may be located entirely in the vacuum or other non-atmospheric environment inside of the housing.

In another exemplary embodiment as seen in FIG. 5, the read-head may have a casing 252' sealed to housing 105 with seal 256 with an active component 254' that may be isolated from in the vacuum or other non-atmospheric environment inside of the housing by casing 252'.

In another exemplary embodiment as seen in FIG. 6, the read-head may have a casing 252" sealed to housing 105 with seal 256 with an active component 254" that may be partially exposed 258 to the vacuum or other non-atmospheric environment while another part 260 of the active component of the read-head may be present in the surrounding atmospheric environment. In this case, the read-head may be located in an opening in the housing of the direct-drive module and sealed with respect to the wall of the housing. The seal 256 may be compressible to allow for adjustment of the read-head with respect to the track. Alternatively, an angular-contact, axial or radial contact type of sealing arrangement may be utilized to provide a larger adjustment range. As another alternative, a flexure, membrane or bellows may be employed to allow for adjustment of the read-head with respect to the track.

In another exemplary embodiment as seen in FIG. 7, the read-head may have a casing 252''' sealed to housing 105 with seal 256 with an active component 254''' that utilizes vacuum-compatible encapsulation, including the described encapsulation alternatives and enhancements to minimize the risk of out-gassing and protects the stator from the environment, e.g., prevents corrosion, and facilitates efficient heat removal, and may be used or two separation walls 262, 264 may be incorporated, for example, to isolate different portions 266, 268 of the read head from one or more environment.

FIG. 8 shows an exemplary read head mounting arrangement. As seen in FIG. 9, the encoder has disk 304 rotationally mounted on axis 306 and read head 302 movably mounted with respect to housing 105 and sealed to housing 105 with seal 256. Here seal 256 may be an O-ring, flexure or other suitable seal providing read head 302 sufficient movement radially, axially and also angular movement or otherwise with respect to disk 304 and while maintaining a seal, for example, a vacuum seal. Here disk 304 may be of solid construction of metal with a pattern of lines or spaces for inductive sensing by read head 302 or otherwise. Housing 105 has pins 308 that correspond to a mating hole and slot of head 302 such that head 302 is positively located with respect to housing 105 and disk 304 rotationally mounted therein. Screws 310 fasten head 302 to housing 105 where three set screws 312 allow head 302 to be radially adjusted relative to disk 304 and leveled or otherwise adjusted with respect to disk 304. In this manner, the location of read head 302 with respect to disk 304 may be adjusted without breaking the vacuum environment. In alternate aspects, any suitable locating or leveling features may be provided.

FIG. 11 shows an exemplary read head mounting arrangement. The encoder has disk 304' rotationally mounted on axis 306 and read head 302' movably mounted with respect to housing 105 and sealed to housing 105 with seal 256. Here seal 256 may be an o-ring, flexure or other suitable seal providing read head 302 sufficient movement radially, axially also angular movement or otherwise with respect to disk 304 and while maintaining a seal, for example, a vacuum seal. Here disk 304 may be of opaque construction of glass or otherwise with a pattern of lines or spaces for optical sensing by read head 302' or otherwise. Housing 105 has pins 308 shown in FIG. 10 that correspond to a mating slot of head 302' such that head 302' is positively located with respect to housing 105 and disk 304' rotationally mounted therein. Screws 310 fasten with vertical slots of head 302' to housing 105 where three set screws 312 allow head 302 to be radially adjusted relative to disk 304 and leveled or otherwise adjusted with respect to disk 304. Eccentrics 314 are further provided rotationally coupled to housing 105 and engaging mating horizontal slots of read head 302' such that the location of head 302' with respect to disk 304' may be axially adjusted. In this manner, the location of read head 302' with respect to disk 304' may be adjusted without breaking the vacuum environment. In alternate aspects, any suitable locating or leveling features may be provided.

Figure 12:
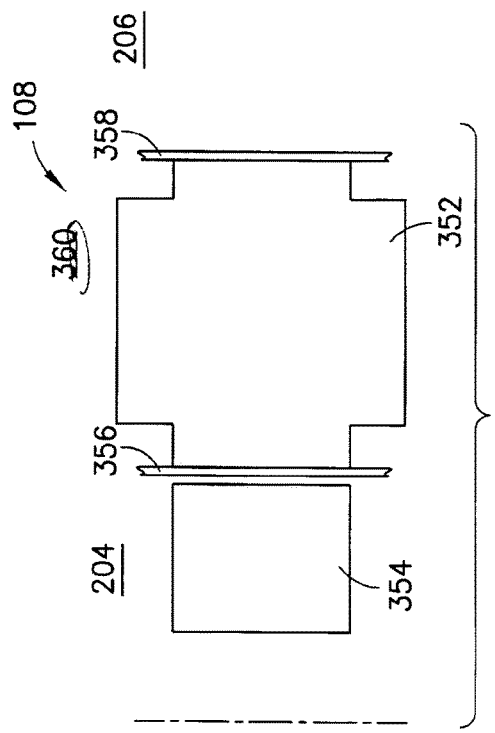
FIGS. 12-19 are schematic view of various separation wall configurations.

FIGS. 12-19 show various combinations of separation walls with respect to motor 108. Here, as will be described, the separation wall may form an encapsulation, separation, vacuum or gas barrier, for example, to isolate two or more areas or environments. Here motor 108 is shown in partial section and may be exemplary where in alternate embodiments, any suitable motor, combination of motors and/or combination of separation wall(s) may be provided. In FIG. 12, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 and separates rotor 354 from stator 352. Alternately, separation wall 356 may be a coating, plating, molded portion, formed portion and having any shape or any suitable separation wall or combination of separation wall(s) and wall type(s). Further, separation wall 356 may be integrally formed as part of housing 105 or may be separate from housing 105.

Figure 13:
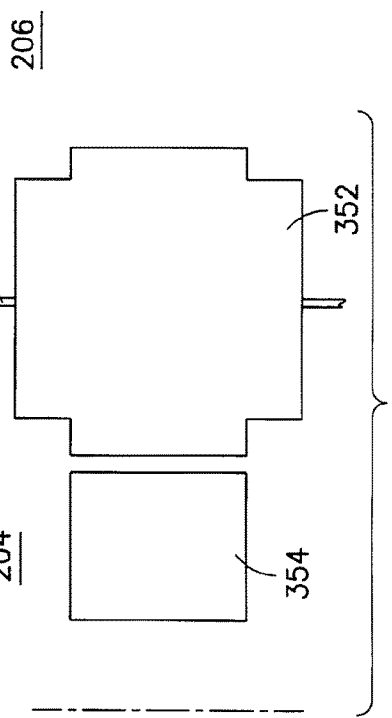

In FIG. 13, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 and separates rotor 354 from stator 352. Separation wall 358 may further be a thin walled tubular metal structure that separates environment 204 from that of environment 206. Alternately, separation walls 356, 358 may be any suitable shape, for example separation walls 356, 358 may form a partial or complete enclosure enclosing stator 352 such that a third environment 360 within the enclosure is formed isolated from environment 204 and/or environment 206. Alternately walls 356, 358 may be a coating, plating, molded portion, formed portion having any shape or any suitable separation wall or combination of separation wall(s) and wall type(s). Further, one or more of separation wall 356, 358 may be integrally formed as part of housing 105 or may be separate from housing 105.

Figure 14:
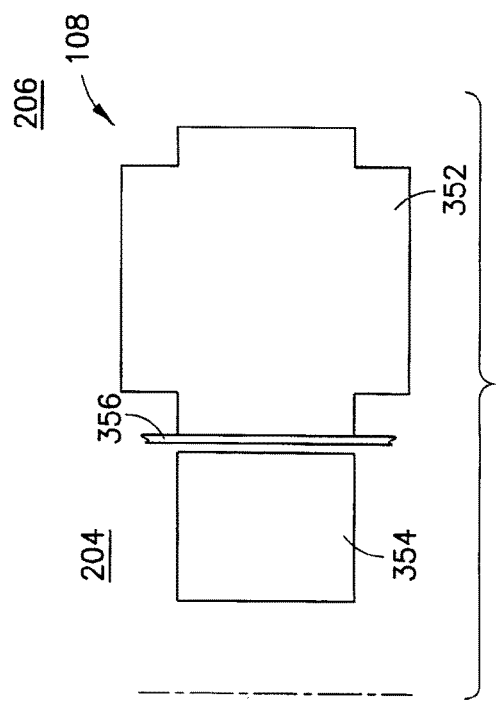

In FIG. 14, motor 108 has stator 352 and rotor 354 each of which may have any suitable combination of core(s), magnet(s), winding(s) or otherwise. Separation wall 356 may be a thin walled tubular metal structure that separates environment 204 from that of environment 206. Alternately, separation wall 356 may be a coating, plating, molded portion, formed portion and having any shape or any suitable separation wall or combination of separation wall(s) and wall type(s). Further, separation wall 356 may be integrally formed as part of housing 105 or may be separate from housing 105.

Figure 15:
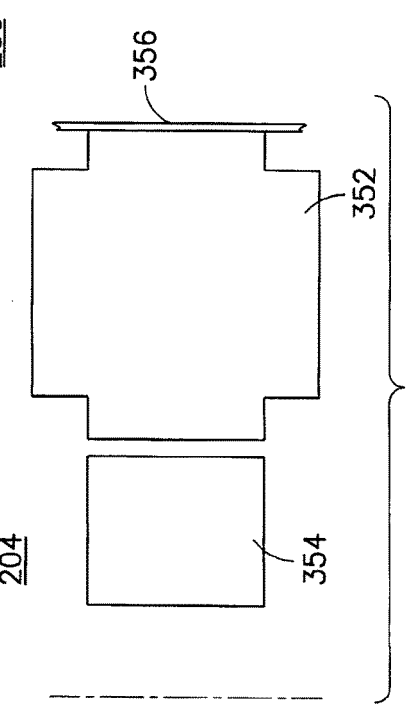

In FIG. 15, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 where stator 352 is exposed to both environment 204 and 206 and forms a portion of wall 356. Alternately, separation wall 356 may be a coating, plating, molded portion, formed portion and having any shape or any suitable separation wall or combination of separation wall(s) and wall type(s). Further, separation wall 356 may be integrally formed as part of housing 105 or may be separate from housing 105.

Figure 16:
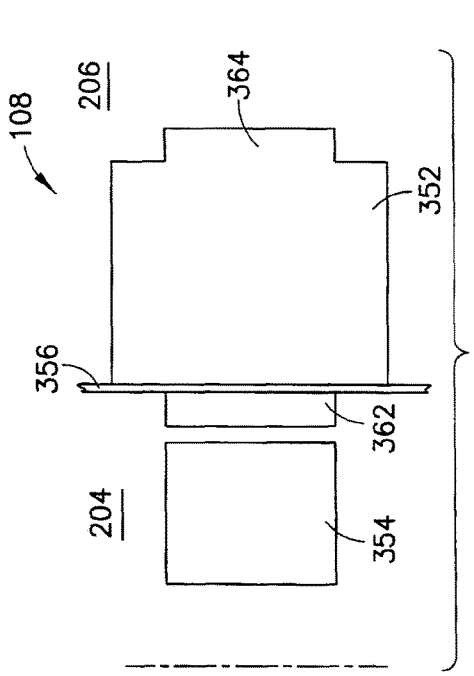

In FIG. 16, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 where stator 352 is exposed to both environment 204 and 206 with a portion of wall 356 separating a portion 362 of stator 352 from another portion 364 of stator 352. Alternately, separation wall 356 may be a coating, plating, molded portion, formed portion and having any shape or any suitable separation wall or combination of separation wall(s) and wall type(s). Further, separation wall 356 may be integrally formed as part of housing 105 or may be separate from housing 105.

Figure 17:
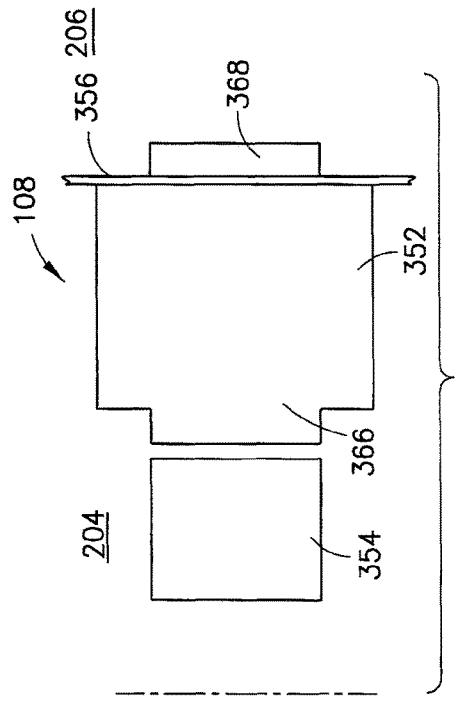

In FIG. 17, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 where stator 352 is exposed to both environment 204 and 206 with a portion of wall 356 separating a portion 366 of stator 352 from another portion 368 of stator 352. Alternately, separation wall 356 may be a coating, plating, molded portion, formed portion and having any shape or any suitable separation wall or combination of separation wall(s) and wall type(s). Further, separation wall 356 may be integrally formed as part of housing 105 or may be separate from housing 105.

Figure 18:
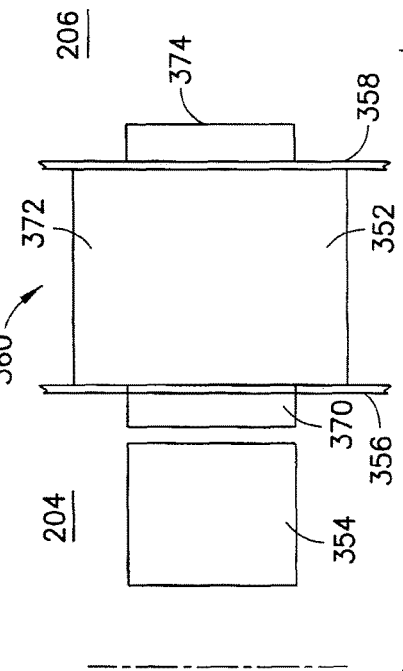

In FIG. 18, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 and separates rotor 354 from a portion of stator 352. Separation wall 358 may further be a thin walled tubular metal structure that separates environment 204 from that of environment 206. Alternately, separation walls 356, 358 may be any suitable shape, for example separation walls 356, 358 may form a partial or complete enclosure enclosing stator 352 such that a third environment 360 within the enclosure is formed isolated from environment 204 and/or environment 206. Stator 352 is shown having a first portion 370 in environment 204, second portion 372 in environment 360 and third portion 374 in environment 206. Alternately walls 356, 358 may be a coating, plating, molded portion, formed portion having any shape or any suitable separation wall or combination of separation wall(s) and wall type(s). Further, one or more of separation wall 356, 358 may be integrally formed as part of housing 105 or may be separate from housing 105.

Figure 19:
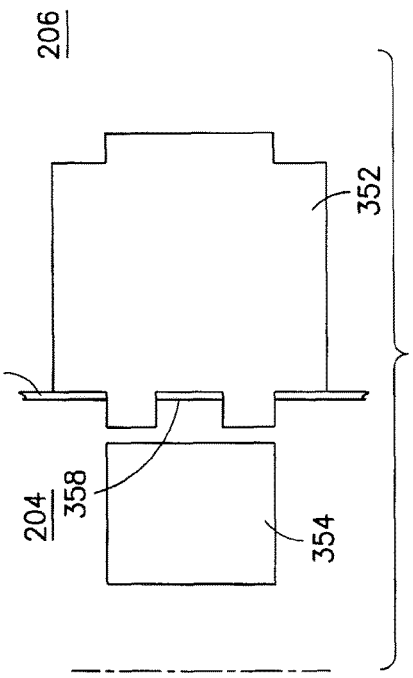

In FIG. 19, motor 108 has stator 352 and rotor 354 each of which may have any suitable combination of core(s), magnet(s), winding(s) or otherwise. Separation wall 356 may be a thin walled tubular metal structure that separates environment 204 from that of environment 206 where stator 352 is exposed to both environment 204 and 206 and forms a portion of wall 356. Separation wall 358 may be a thin walled tubular metal structure that separates environment 204 from that of a portion of stator 352 where stator 352 is exposed to both environment 204 and 206 and forms a portion of wall 356. Alternately, separation wall 356 may be a coating, plating, molded portion, formed portion and having any shape or any suitable separation wall or combination of separation wall(s) and wall type(s). Further, separation wall 356 may be integrally formed as part of housing 105 or may be separate from housing 105. In alternate aspects, one or more of the features may be combined, for example, one or more of the features of embodiments of FIGS. 12-23 may be combined in any suitable arrangement or combination.

Figure 20:
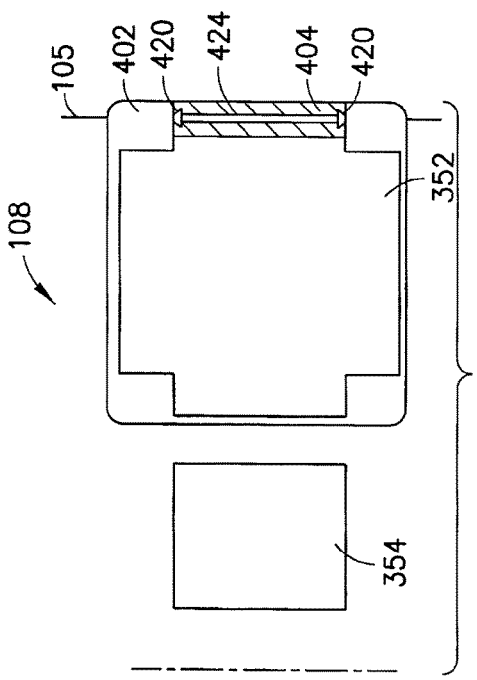
FIGS. 20-23 are schematic views of various stator and rotor combinations with stator encapsulation.

FIG. 20 shows an example of a stator 352 and rotor 354. Stator 352 may have a toothed (slotted) iron core, which may provide desirably high torque constant and efficiency. Alternately, stator 352 of the vacuum-compatible drive module may be of a toothless (slotless) design, which may provide desirably low level of cogging. Alternatively, stator 352 of the vacuum-compatible drive module may be of an ironless (coreless) design. Alternately, rotor 354 and stator 352 may be any suitable rotor or stator. Stator 352 may be encapsulated with encapsulation 402 that may be vacuum compatible epoxy with a filler or any suitable encapsulation. The encapsulation may completely or partially surround and encapsulate stator 352. For example, a metal or any other suitable material that for example has good heat transfer or other desired properties forming ring 404 may be provided in contact with housing 105 while a portion (or none) of encapsulation 402 is or may also be in contact with housing 105. Alternately, encapsulation 402 may not be in contact with housing 105, for example, where stator 352, ring 404 and encapsulation 402 may be formed as a discrete assembly and subsequently installed in housing 105. Here stator 352 may have ring 404 pressed or otherwise fastened there on and being subsequently potted with encapsulation 402. Encapsulation 402 may be performed by evacuating a mold with stator 352 and/or ring 404 therein and introducing a liquid resin therein to form the external envelope of encapsulation 402. Here, a portion of the ring, stator or other suitable component may or may not form a portion of the mold. Alternately and as will be shown, an integral enclosure may form the mold all or in part that defines the volume of the encapsulation. When formed as an assembly independent of housing 105, the assembly 352, 404, 402 may then be assembled to housing 105 by a press fit or other suitable fastening. Here, heat may be transferred from the windings and laminations or core of stator 352 and through encapsulation and/or ring 404 to be dissipated through housing 105. Here, for example, stator 352 may have pressed or otherwise fastened by fasteners, adhesive or otherwise fastened ring 404 in contact with housing 105 where fastening the ring to the stator and/or housing is such that that there is sufficient contact with the stator and/or the housing to provide a sufficient heat transfer path from the stator to the ring and to the housing or other sinking source. Encapsulation 402 may be integrally molded with housing 105 and stator 352 or separately molded, for example as an assembly with stator 352, ring 404 as an assembly to be installed in housing 105 as described or otherwise. Ring 404 may further have axial holes 424 and trapezoidal cuts 420 formed to facilitate bonding of encapsulation 402 and resolution of internal stresses such as due to thermal expansion of the potting material. Here, the function of the ring 404 may be to provide a path to remove heat from the stator 352 and transfer it to the housing 105, which may be cooled, for example, externally or otherwise cooled, while keeping a continuous protection barrier around the stator, for example, where a stator may be formed from laminates, ring 404 forms a continuous protection barrier as compared to non continuous laminations. Alternately, encapsulation 402 and housing 105 may be made of the same material, for example, where housing 105 and encapsulation 402 are molded as a unitary structure with stator encapsulated in whole or in part there in a unitary material 105 and 402. Here, encapsulation 402 may form a separation barrier and may provide protection from the environment, e.g., to prevent corrosion, and/or facilitate heat removal as previously described. Although FIG. 20 shows ring 404 used in various combinations with stator 352, encapsulation 402 and housing 105, alternately, encapsulation 402 may apply to embodiments with or without the ring, housing 105 or otherwise as a unitary structure with or without another component or otherwise. Accordingly, all such variations are embraced.

Figure 21:
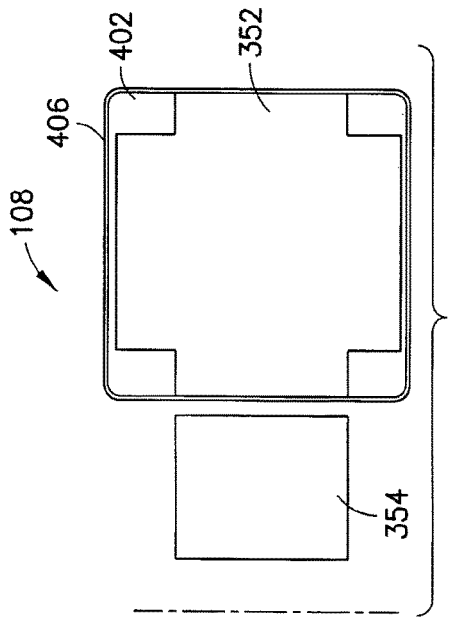
Figure 22:
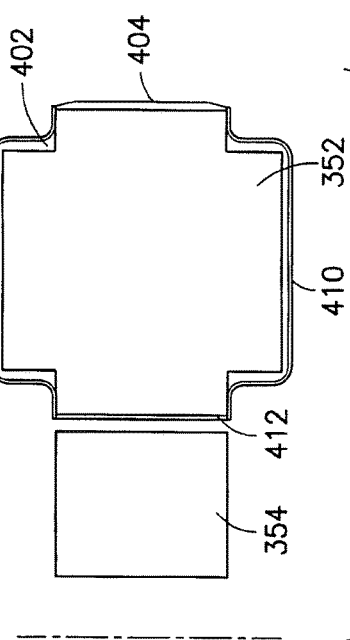

As shown in FIG. 21, the exposed surfaces of the stator encapsulation 402 of the vacuum-compatible direct-drive module may be coated either completely or in part with coating 406, e.g., utilizing electroless nickel plating, to eliminate or minimize exposure of the potting material used for the encapsulation of the stator to the vacuum, atmospheric, sub-atmospheric, pressurized, or other non-atmospheric environment to further reduce the risk of outgassing. Here, coating 406 may form a separation barrier as previously described. Alternatively, as seen in FIG. 22, one or more thin sheets of protective material 408, 410, 412, e.g., made of stainless steel or another suitable material, may be bonded to the encapsulation of the stator, for example, in the potting process, as shown in FIG. 22. This may limit the exposure of the potting material to the seams between the thin sheets of protective material. Here, potting material 402 may form a seal between sheets 408, 412, 410 or the sheets may be otherwise sealed, for example, by welding, brazing, soldering or with any suitable static seal, such as o-rings or otherwise. Here, sheets 408, 410, 412 and ring 404 may form a separation barrier as previously described. Here, the stator may be enclosed in a thin cage or enclosure bonded to the potting material, for example, in the potting process. The thin cage or enclosure may be, e.g., welded from thin sheets of stainless steel.

Figure 23:
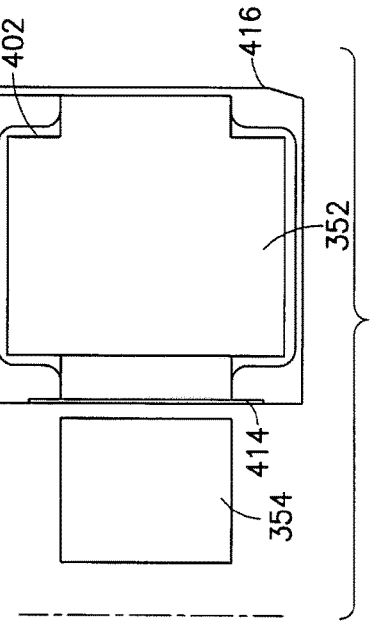

In FIG. 23, an enclosure, for example of machined or otherwise formed aluminum or stainless steel or other suitable material is provided having sleeve 414, lower casing 416 and upper casing 418. Each may be sealed by potting 402 or otherwise sealed, for example, by welding, brazing, soldering or with any suitable static seal, such as o-rings or otherwise. Here, potting 402 may not be provided and where the interior volume of the casing may form an intermediate environment, for example, environment 360 or otherwise. Alternately, more or less or partial casing(s) may be provided, for example, where the windings of a stator are potted but the teeth are not or otherwise. Here, a small gap may be provided between the stator and the rotor, which preserves the torque output and efficiency of conventional motor designs. Here, with radial-field motors, a separation layer may be incorporated into the stator(s), for example, by the means of coating, bonding or by any other suitable method. As another alternative, the stator(s) may be molded or otherwise packaged in a material compatible with and resistant to vacuum or any other environment the stator(s) may be subject to. As a further alternative, the stator may be encapsulated in a vacuum tight vessel as seen in FIG. 23. Similarly, the rotor may be coated, carry a bonded protection layer, molded or packaged in a protective material, encapsulated in a vacuum tight vessel or otherwise protected from the environment it may operate in.

The exposed surfaces of the stator encapsulation may be coated, for example, as in FIG. 21, e.g., utilizing electroless nickel plating, to eliminate or minimize exposure of the potting material used for the encapsulation of the stator to the vacuum or other non-atmospheric environment to further reduce the risk of out-gassing. Alternatively, thin sheets of protective material, for example, as seen in FIG. 22, e.g., made of stainless steel, may be bonded to the encapsulation of the stator, preferably in the potting process, as shown in FIG. 22. This limits the exposure of the potting material to the seams between the thin sheets of protective material. As another alternative, as shown in FIG. 23, the stator may be enclosed in a thin enclosure bonded to the potting material, preferably in the potting process. The enclosure may be, e.g., welded from thin sheets of stainless steel. As yet another alternative, a thin separation wall, for example, in the form of a disk 412, may be present between the stator and rotor of the axial-field motor. The stator may be pressed, bonded, clamped, bolted or attached in any other suitable manner to the housing of the direct-drive module as seen in FIG. 20.

The above described radial, axial or combination radial-axial-field motor may be of coreless (ironless) design. In another example embodiment with a motor arrangement, a coreless stator with windings and two rotors with magnets, each rotor on one side of the stator, may be utilized. Alternatively, the stator may include an iron core as the passive magnetic forces exerted on the iron core by the two rotors may be balanced. Yet another example embodiment with a motor arrangement may include two stators with windings and a single rotor with magnets sandwiched between them. Vacuum-compatible encapsulation, including the above described encapsulation alternatives and enhancements to minimize the risk of out-gassing and/or enhance heat transfer, may be used or two or more separation walls may be incorporated into these example embodiments as described.

In another embodiment of the vacuum-compatible direct-drive system of this invention, the motor configuration(s) utilized in the above examples may be replaced by a different motor topology, including without limitation a hybrid-field (radial-axial) configuration. For instance, the stator(s) and rotor(s) may feature a conical, convex v-shaped, concave v-shaped, convex semicircular or concave semicircular profile, any combination of conical, v-shaped and semicircular profiles, or any other suitable profile, resulting in a substantially uniform gap or gaps between the stator(s) and rotor(s). Vacuum-compatible encapsulation, including the above described encapsulation alternatives and enhancements to minimize the risk of out-gassing, may be used, or a separation wall of a suitable shape may be present in the gap(s). Outer-stator-inner-rotor and inner-stator-outer-rotor configurations may be used. In an alternate embodiment, the entire housing 105 may be formed or otherwise molded where the stator may be incorporated directly into the molded housing. As an alternative to molding, casting or spray forming or any suitable fabrication of any suitable alternative material may be provided. In alternate embodiments, any suitable number of winding phases, distributed or otherwise may be provided within the stator. In alternate embodiments, for example, with respect to the passive magnetless rotor or any suitable rotor described, the rotor may not be solid, for example, where the rotor is laminated in some fashion but vacuum compatible to reduce losses.

Figure 24:
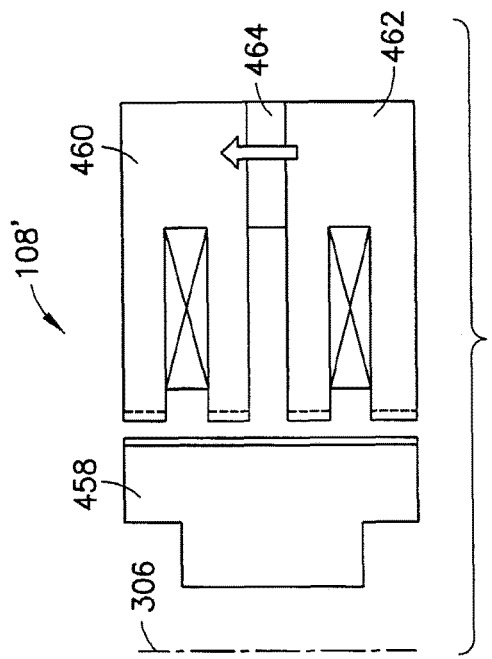
FIG. 24 illustrates a motor having a radial field arrangement.

As seen in FIG. 24, the vacuum-compatible direct-drive system may employ a radial field motor arrangement 108 including a wound brushless stator 352 and a rotor 354 with magnets 452 arranged in the vicinity of the stator so that it may rotate with respect to the stator and interact with the stator through a magnetic field substantially radial with respect to the axis of rotation 306 of the rotor. The stator may have windings 454, core 456 and backing ring 404. Alternately, stator 352 may be coreless where the coreless stator may consist of a set of windings energized by a suitable controller based on the relative position of the rotor with respect to the stator. The rotor 354 may include a set of permanent magnets 452 with alternating polarity. As described, the stator may be encapsulated in a suitable material, such as vacuum compatible epoxy based potting, to limit out-gassing of the stator components to the vacuum or other non-atmospheric environment. The encapsulation may also bond the stator to the housing of the direct-drive module, further securing the stator with respect to the housing as seen in FIG. 20. The wires leading to the windings of the stator may pass through an opening of the housing which is sealed by the encapsulation as seen in FIG. 2, thus eliminating the need for a separate vacuum feed-through as seen in FIG. 3. Alternatively, the wires leading from the atmospheric environment to the windings of the stator of the radial field motor may be routed through a vacuum feed-through or passed through the wall of the housing of the direct-drive module in any other suitable manner.

Figure 25:
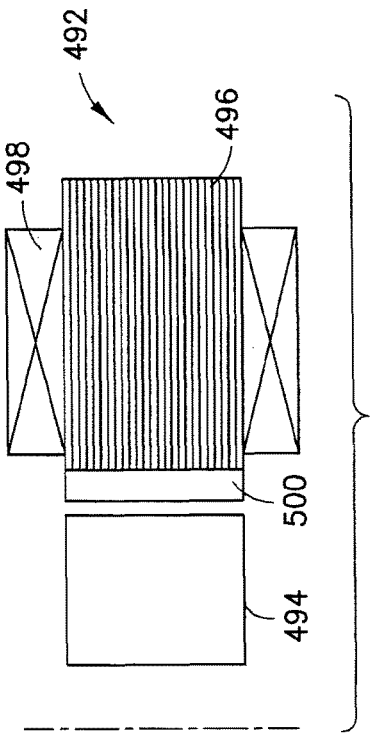
FIG. 25 illustrates a hybrid motor design having a toothed passive rotor, a stator phase A and stator phase B separated by ring permanent magnet.

As seen in FIG. 25, motor 108 may be motor 108' that may be a hybrid design having toothed passive rotor 458, stator phase A 460 and stator phase B 462 separated by ring permanent magnet 464. A suitable example may be found in U.S. Pat. No. 5,834,865 entitled "Hybrid Stepping Motor" which is hereby incorporated by reference in its entirety. Alternately, the ring magnet may be provided within rotor 458. As shown, a solid non magnetic passive rotor, for example, not containing permanent magnets and having high permeability/saturation and low coercivity, for example, of 400 series stainless steel having no magnets may be provided to reduce outgassing where the stator portion(s) may be provided with one or more separation walls as previously described. Such arrangement minimizes exposed materials to vacuum, for example, where the magnets are not exposed to vacuum. Similarly, such a nonmagnetic passive rotor, not containing permanent magnets, may be used in combination with any suitable stator, such as any of the exemplary embodiment stators or otherwise disclosed embodiments.

Figure 26:
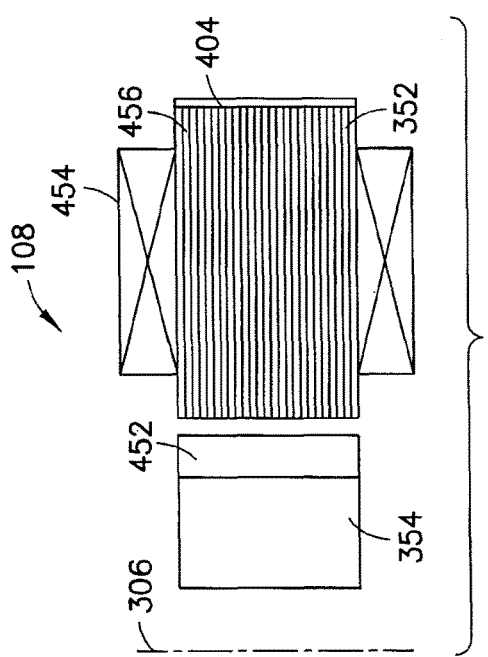
FIG. 26 illustrates a motor having an axial field design.

As seen in FIG. 26, motor 108 may be motor 108" that may be an axial field design having rotor 470 with magnets 472, and stator 474 with core 476 and windings 478. Alternately, the magnets may be provided within the stator.

Figure 27:
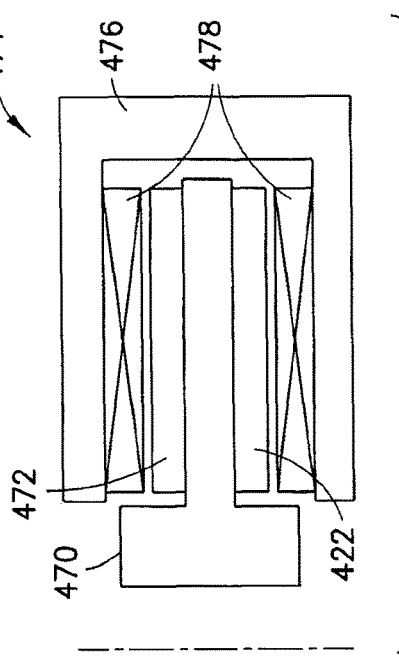
FIG. 27 illustrates a motor having a brushless design with a passive rotor.

As seen in FIG. 27, motor 108 may be motor 490 that may be a brushless design having a passive rotor 494 and stator 492 as will be described in greater detail. Here stator 492 may have core 496 (solid or laminated), windings 498 and magnets 500. As shown, a solid non-magnetic passive rotor as described, for example, of 400 series stainless steel having no magnets may be provided to reduce outgassing where the stator portion(s) may be provided with one or more separation walls as previously described. Such arrangement minimizes exposed materials to vacuum, for example, where the magnets are not exposed to vacuum. Similarly, such a nonmagnetic passive rotor, not containing permanent magnets, may be used in combination with any suitable stator, such as any of the exemplary embodiment stators or otherwise disclosed embodiments.

Figure 29:
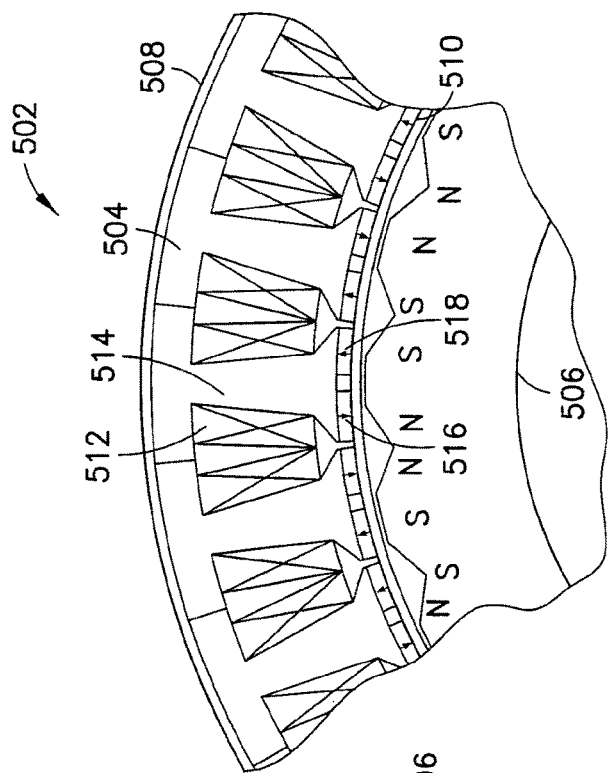
FIGS. 28-29 illustrate a motor with a toothed passive rotor.
Figure 28:
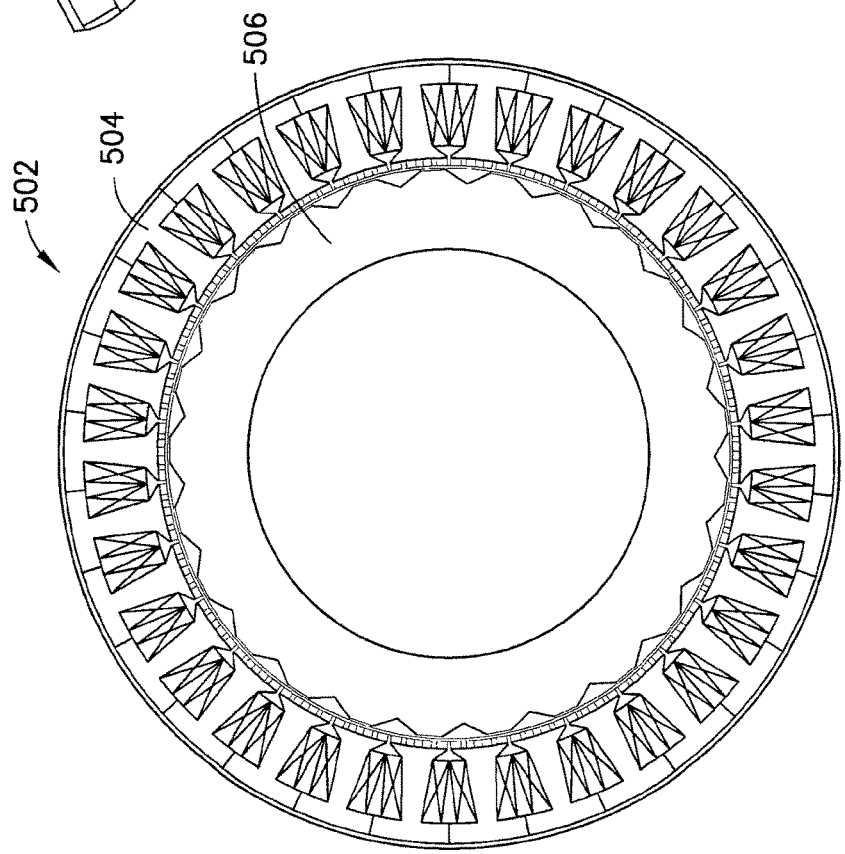

As seen in FIGS. 28 and 29, motor 502 is provided having features similar to that shown in FIG. 27. A liner variant may be found in U.S. Pat. No. 7,800,256 entitled "Electric Machine" which is hereby incorporated by reference in its entirety. Motor 502 has stator 504 and toothed passive rotor 506. Rotor 506 may be 400 series stainless steel or any suitable material that can channel the magnetic flux from stator 504 but without permanent magnets. Stator 504 may be separated from rotor 506 by one or more separation walls 508, 510 as previously described where walls 508, 510 may be 300 series stainless steel, aluminum or other suitable material that allows field interaction between rotor 506 and stator 504. Stator 504 has salient windings 512 on teeth 514 with two alternating magnets 516, 518 on each tooth and where magnets on adjacent teeth have matching polarity with respect to the tooth as shown. Alternately, distributed windings may be provided. Flux is selectively directed by a given winding to one of the two magnets on the tooth depending on the polarity of the winding. Flux is directed from each tooth through the teeth on the rotor to and adjacent tooth of the stator to selectively commutate the motor. In alternate aspects, any suitable motor having a non magnetic passive rotor may be provided.

Figure 31:
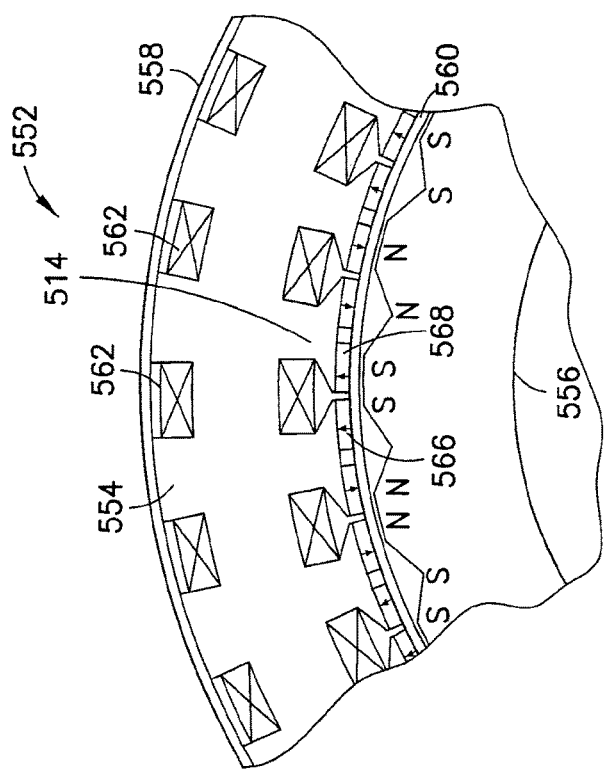
FIGS. 30-31 illustrate a motor with a toothed passive rotor.
Figure 30:
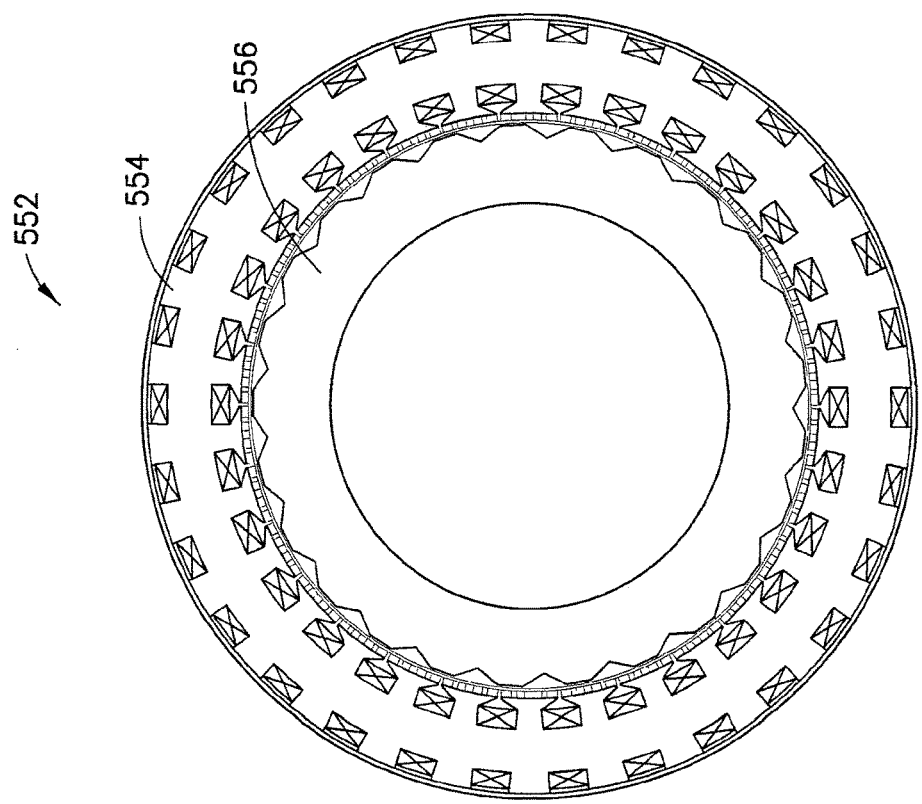

As seen in FIGS. 30 and 31, motor 552 is provided having features similar to that shown in FIGS. 27, 28 and 29. Motor 552 has stator 554 and toothed passive rotor 556. Rotor 556 may be 400 series stainless steel or any suitable material that can channel the magnetic flux from stator 554 but without permanent magnets. Stator 554 may be separated from rotor 556 by one or more separation walls 558, 560 as previously described where walls 558, 560 may be 300 series stainless steel, aluminum or other suitable material that allows field interaction between rotor 556 and stator 554. Stator 554 has salient tangentially wound windings 562 between teeth 564 with two alternating magnets 566, 568 on each tooth and where magnets on adjacent teeth have matching polarity with respect to the tooth as shown. Alternately, distributed windings may be provided. Flux is selectively directed by a given winding to one of the two magnets on the tooth depending on the polarity of the winding. Flux is directed from each tooth through the teeth on the rotor to and adjacent tooth of the stator to selectively commutate the motor. In alternate aspects, any suitable motor having a non magnetic passive rotor may be provided.

Figure 33:
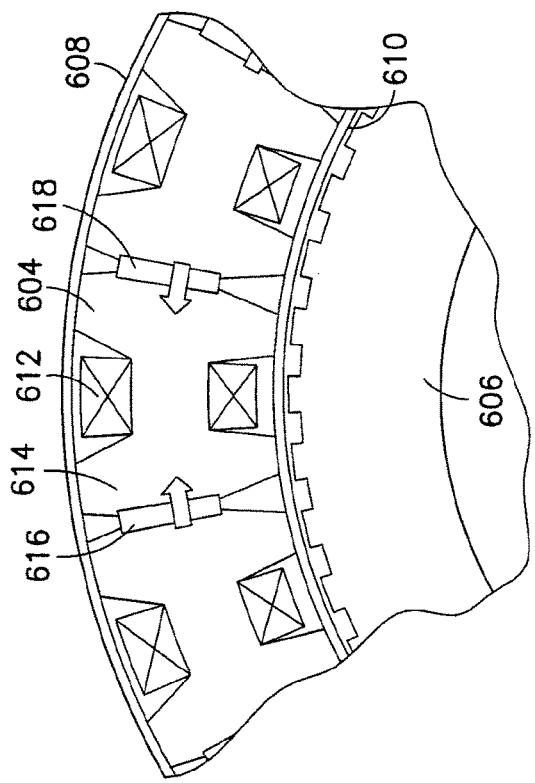
FIGS. 32-33 illustrate a motor with a toothed passive rotor.
Figure 32:
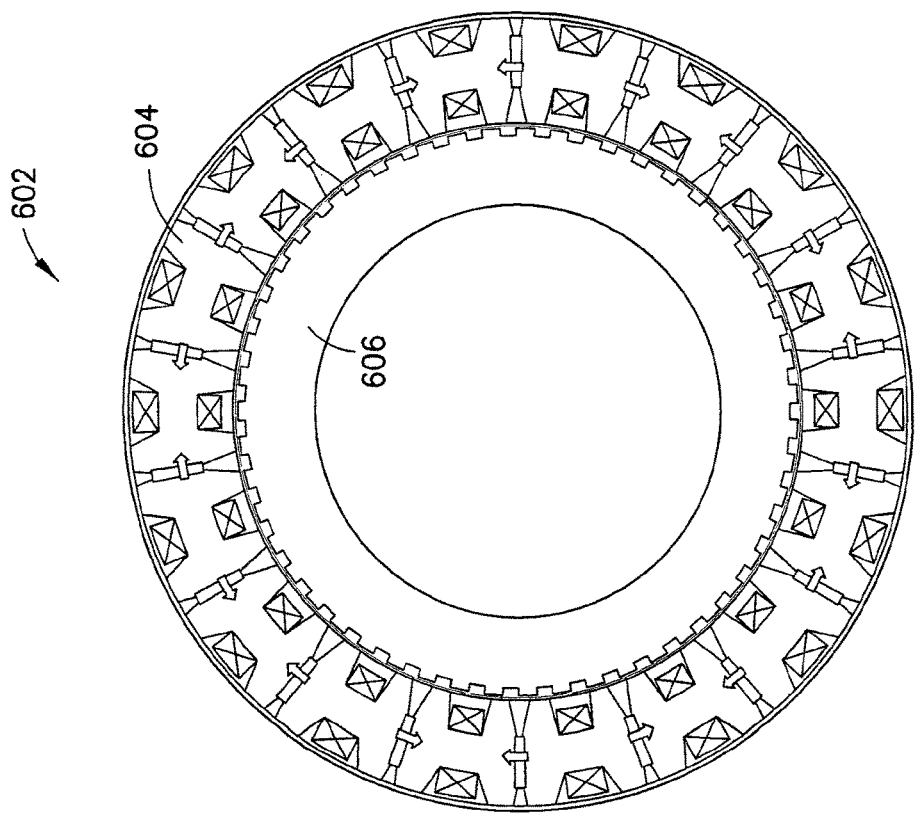

As seen in FIGS. 32 and 33, motor 602 is provided having features similar to that shown in FIG. 27. A similar device may be found in U.S. Pat. No. 7,898,135 entitled "Hybrid Permanent Magnet Motor" and U.S. Patent Publication No. 2011/0089751 A1 entitled "Parallel Magnetic Circuit Motor" both of which are hereby incorporated by reference in its entirety. Motor 602 has stator 604 and toothed passive rotor 606. Rotor 606 may be 400 series stainless steel or any suitable material that can channel the magnetic flux from stator 604 but without permanent magnets. Stator 564 may be separated from rotor 606 by one or more separation walls 608, 610 as previously described where walls 608, 610 may be 300 series stainless steel, aluminum or other suitable material that allows field interaction between rotor 606 and stator 604. Stator 604 has salient tangential windings 612 on core 614, with each core having two teeth and with two alternating magnets 616, 618 on each core and where magnets on adjacent cores have opposing polarity with respect to the core as shown. Alternately, distributed windings may be provided. Flux is selectively directed by a given winding to one of the two teeth on the core depending on the polarity of the winding. Flux is directed from each tooth through the teeth on the rotor to an adjacent tooth of the stator to selectively commutate the motor. In alternate aspects, any suitable motor having a non magnetic passive rotor may be provided.

As seen in FIGS. 34 and 35, motor 652 is provided having features similar to that shown in FIG. 27. A liner variant may be found in U.S. Pat. No. 7,800,256 entitled "Electric Machine" which is hereby incorporated by reference in its entirety. Motor 652 has stator 654 and toothed passive rotor 656. Rotor 656 may be 400 series stainless steel or any suitable material that can channel the magnetic flux from stator 504 but without permanent magnets. Stator 654 may be separated from rotor 656 by one or more separation walls 658, 660 as previously described where walls 658, 660 may be 300 series stainless steel, aluminum or other suitable material that allows field interaction between rotor 656 and stator 654. Stator 654 has salient windings 662 on teeth 664 with two alternating magnets 666, 668 on opposing sides of the core of each tooth and where magnets on cores of adjacent teeth have opposing polarity with respect to the tooth as shown. Alternately, distributed windings may be provided. Flux is selectively directed by a given winding to the tooth depending on the polarity of the winding. Flux is directed from each tooth through the teeth on the rotor to and adjacent tooth of the stator to selectively commutate the motor. In alternate aspects, any suitable motor having a non magnetic passive rotor may be provided.

Figure 37:
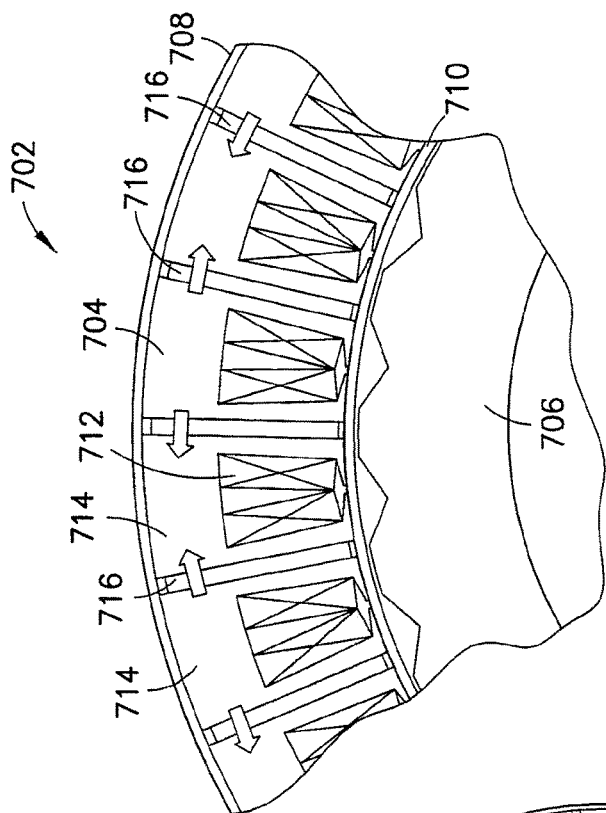
FIGS. 36-37 illustrate a motor with a toothed passive rotor.
Figure 36:
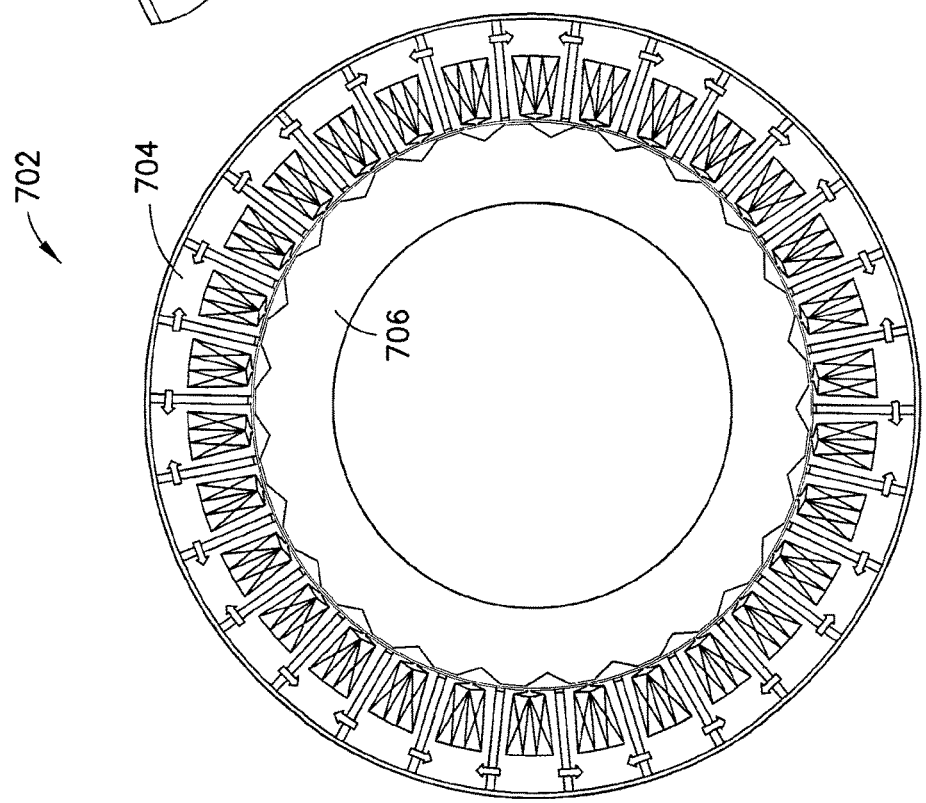

As seen in FIGS. 36 and 37, motor 702 is provided having features similar to that shown in FIG. 27. A liner variant may be found in U.S. Pat. No. 7,800,256 entitled "Electric Machine" which is hereby incorporated by reference in its entirety. Motor 702 has stator 704 and toothed passive rotor 706. Rotor 706 may be 400 series stainless steel or any suitable material that can channel the magnetic flux from stator 504 but without permanent magnets. Stator 704 may be separated from rotor 706 by one or more separation walls 708, 710 as previously described where walls 708, 710 may be 300 series stainless steel, aluminum or other suitable material that allows field interaction between rotor 706 and stator 704. Stator 704 has salient windings 712 on split teeth 714 with a magnet 716 splitting each tooth and where magnets on adjacent teeth have opposing polarity with respect to the tooth as shown. Alternately, distributed windings may be provided. Flux is selectively directed by a given winding to one of the two split portions of the tooth depending on the polarity of the winding. Flux is directed from each tooth through the teeth on the rotor to and adjacent tooth of the stator to selectively commutate the motor. In alternate aspects, any suitable motor having a non magnetic passive rotor may be provided.

An example substrate transport apparatus may comprise a drive section comprising a first motor, where the first motor comprises a stator and a passive rotor; and a first movable arm assembly connected to the first motor. The substrate transport apparatus may be configured for the first movable arm assembly to be positionable in a vacuum chamber 4 (see FIG. 1) with the passive rotor being in communication with an environment inside the vacuum chamber.

The first motor may be a radial field motor arrangement. The stator may comprise a coil and a permanent magnet. The passive rotor may comprise no coil and no permanent magnet. The passive rotor may comprise a stainless steel one piece member. The first motor may be a linear motor arrangement. The passive rotor may comprise a tooth surface facing the stator. The substrate transport apparatus may further comprise a gas barrier located between the stator and the passive rotor to separate the environment at the passive rotor (environment in chamber 4 and extending into the motor region of the drive 10) from an environment at the stator (such as atmospheric 6). The gas barrier may comprise at least one separation wall. The separation wall may comprise a stainless steel, or aluminum, or other material that allows magnetic field interaction between the passive rotor and the stator. The gas barrier may comprise a housing surrounding substantially entirely around the stator. The housing may comprise an encapsulation material surrounding the stator. The encapsulation material may comprise an overmolded polymer material which has been molded onto the stator.

An example method may comprise providing a substrate transport apparatus comprising a drive section and a first movable arm assembly connected to the drive section, where the drive section comprises a motor comprising a stator and a passive rotor; and connecting the substrate transport apparatus to a vacuum chamber, where the first movable arm assembly is positioned in the vacuum chamber with the passive rotor being in communication with an environment inside the vacuum chamber.

Providing the substrate transport apparatus comprises the stator may include a coil and a permanent magnet, and the passive rotor may have no coil and no permanent magnet. The method may further comprise locating a gas barrier between the stator and the passive rotor to separate the environment at the passive rotor from an environment at the stator. The gas barrier may comprise at least one separation wall being located between the stator and the passive rotor. The gas barrier may comprise encapsulating the stator with an encapsulation material. The gas barrier may comprise enclosing the stator inside an enclosure, where a wall of the enclosure is located in a gap between the stator and the passive rotor.

An example substrate transport apparatus may comprise a drive section comprising a first motor, where the first motor comprises a stator and a passive rotor; a first movable arm assembly connected to the first motor; and a gas barrier located in a gap between the stator and the passive rotor to separate an environment at the passive rotor from an environment at the stator.

It should be understood that the foregoing description is only illustrative. Various alternatives and modifications can be devised by those skilled in the art. For example, features recited in the various dependent claims could be combined with each other in any suitable combination(s). In addition, features from different embodiments described above could be selectively combined into a new embodiment. Accordingly, the description is intended to embrace all such alternatives, modifications and variances which fall within the scope of the appended claims.

What is claimed is:

1. An apparatus comprising:
   a motor housing configured to form a first environmental area inside the motor housing separated from a second environmental area outside of the motor housing, where the motor housing comprises electrical connector apertures through the motor housing;
   a plurality of first electrical connectors, where each of the first electrical connectors comprise a projecting pin section;
   a plurality of second electrical connectors, where each of the second electrical connectors comprise a socket section configured to receive the projecting pin section of a respective one of the first electrical connectors; and
   a casing configured to mount to the motor housing, where the casing is configured to press the first electrical connectors or the second electrical connectors against respective seals at respective ones of the electrical connector apertures to seal the electrical connector apertures, where the first electrical connectors contact the respective seals and project through the respective seals,
   where the projecting pin sections of the first electrical connectors are located in the socket sections of the second electrical connectors forming an interference fit therebetween to thereby connect the first and second electrical connectors.

2. An apparatus as in claim 1 where electrical insulating material is located in the electrical connector apertures to electrically insulate the first electrical connectors from the motor housing.

3. An apparatus as in claim 1 where the first electrical connectors each have a lug connected by threads thereto.

4. An apparatus as in claim 1 where the first electrical connectors each have a side projection which is received in a pocket of the casing which the casing presses against to press the first electrical connectors against respective seals.

5. An apparatus as in claim 1 where the seals are located in the electrical connector apertures at seal receiving pockets of the motor housing.

6. An apparatus as in claim 1 where the second electrical connectors are located, at least partially, in portions of the electrical connector apertures.

7. An apparatus as in claim 1 where the projecting pin sections are configured to expand the socket sections when the projecting pin sections are positioned into the socket sections.

8. An apparatus as in claim 1 further comprising means for increasing the interference fit between the projecting pin sections and the socket sections.

9. An apparatus as in claim 8 where the means for increasing the interference fit between the projecting pin sections and the socket sections comprises a tapered section of the socket section.

10. An apparatus comprising:
- a motor housing configured to form a first environmental area inside the motor housing separated from a second environmental area outside of the motor housing, where the motor housing comprises a plurality of electrical connector apertures through the motor housing;
- a plurality of first electrical connectors, where each of the first electrical connectors comprise a projecting pin section;
- a plurality of second electrical connectors, where each of the second electrical connectors comprise a socket section configured to receive the projecting pin section of a respective one of the first electrical connectors; and
- a casing configured to press the first electrical connectors against respective seals at the electrical connector apertures to seal the electrical connector apertures, where the first electrical connectors project through the respective seals,
- where the projecting pin sections of the first electrical connectors are located in the respective socket sections of the second electrical connectors with a press-fit therebetween to thereby connect the first and second electrical connectors.

11. An apparatus as in claim 10 where electrical insulating material is located in the electrical connector apertures to electrically insulate the first electrical connectors from the motor housing.

12. An apparatus as in claim 10 where the first electrical connectors each have a lug connected by threads thereto.

13. An apparatus as in claim 10 where the first electrical connectors each have a side projection which is received in a pocket of the casing, where the casing presses against the side projection at the pocket to press the first electrical connectors against respective seals.

14. An apparatus as in claim 10 where the seals are located in seal receiving pockets of the electrical connector apertures.

15. An apparatus as in claim 10 where the second electrical connectors are located, at least partially, in portions of the electrical connector apertures.

16. An apparatus as in claim 10 where the projecting pin sections are configured to expand the socket sections when the projecting pin sections are positioned into the socket sections.

17. An apparatus as in claim 10 further comprising means for increasing the interference fit between the projecting pin sections and the socket sections.

18. An apparatus as in claim 17 where the means for increasing the interference fit between the projecting pin sections and the socket sections comprises a tapered section of the socket section.

19. A method comprising:
- inserting first electrical connectors into electrical connector apertures in a motor housing;
- pressing projecting pin sections of the first electrical connectors into socket sections of respective second electrical connectors at the electrical connector apertures, where the second electrical connectors are located at least partially in the electrical connector apertures, and where the projecting pin sections form an interference fit connection with the respective socket sections of the second electrical connectors to thereby electrically connect the first and second electrical connectors;
- pressing at least one group of either the first electrical connectors or the second electrical connectors towards the motor housing by a casing to thereby press the electrical connectors of the at least one group against respective seals in the electrical connector apertures, where the seals are located in seal receiving pockets of the electrical connector apertures, where the seals are compressed between the at least one group of electrical connectors and the motor housing to seal the electrical connector apertures.

* * * * *